US011268982B2

(12) United States Patent
Kádár et al.

(10) Patent No.: US 11,268,982 B2
(45) Date of Patent: Mar. 8, 2022

(54) CONTACTING DEVICE, HEAD UNIT FOR THE SAME, AND METHODS FOR MANUFACTURING A CONTACTING DEVICE AND A HEAD UNIT

(71) Applicant: Equip-Test Kft., Vecsés (HU)

(72) Inventors: Géza Kádár, Szentendre (HU); Csaba Kádár, Vecsés (HU); Zoltán Kádár, Szentendre (HU)

(73) Assignee: Equip-Test Kft., Vecses (HU)

( * ) Notice: Subject to any disclaimer, the term of this patent is extended or adjusted under 35 U.S.C. 154(b) by 219 days.

(21) Appl. No.: 16/482,794

(22) PCT Filed: Jan. 22, 2018

(86) PCT No.: PCT/HU2018/000001
§ 371 (c)(1),
(2) Date: Aug. 1, 2019

(87) PCT Pub. No.: WO2018/142170
PCT Pub. Date: Aug. 9, 2018

(65) Prior Publication Data
US 2021/0278439 A1   Sep. 9, 2021

(30) Foreign Application Priority Data
Feb. 2, 2017   (HU) .................... P1700051

(51) Int. Cl.
*G01R 1/067* (2006.01)
*G01R 3/00* (2006.01)
(52) U.S. Cl.
CPC ..... *G01R 1/06722* (2013.01); *G01R 1/06738* (2013.01); *G01R 3/00* (2013.01)
(58) Field of Classification Search
CPC ... G01R 1/06722; G01R 1/06738; G01R 3/00
See application file for complete search history.

(56) References Cited

U.S. PATENT DOCUMENTS

| 4,918,384 A * | 4/1990 | Giringer | ................ H01R 11/18 324/72.5 |
| 6,400,167 B1 * | 6/2002 | Gessford | ............ G01R 1/06788 324/72.5 |

(Continued)

FOREIGN PATENT DOCUMENTS

| DE | 8417746 | 1/1986 |
| DE | 4040312 | 6/1992 |

(Continued)

OTHER PUBLICATIONS

English Translation of JP 2010-85292 A (Year: 2010).*

(Continued)

*Primary Examiner* — Paresh Patel
(74) *Attorney, Agent, or Firm* — Wood Herron & Evans LLP

(57) ABSTRACT

The invention is a contacting device suitable for measurements and/or other contact tests, the device comprising a head unit comprising a plunger (14) having a broadened portion (28) at its first end, and a head element (16) being on a second end of the plunger (14); a tube element (10) having a third end and a fourth end opposite the third end, receiving the broadened portion (28) of the plunger (14) at the third end, and keeping the broadened portion (28) in its inner space by means of an inward-projecting flange portion (18) arranged at the third end; and a resilient element (20) being arranged in the inner space of the tube element (10) being supported against the end portion of the broadened portion (28) and against the closed fourth end of the tube element (10). The second end of the plunger (14) projects out from the tube element (10) in case the broadened portion (28) is abutted against the flange portion (18). In the contacting device according to the invention the head element (16) and the second end of the plunger (14) are connected to each other by shrink fitting or by press fitting. The invention is, (Continued)

furthermore, a head unit for a contacting device, and methods for manufacturing a contacting device and a head unit.

11 Claims, 16 Drawing Sheets

(56) References Cited

U.S. PATENT DOCUMENTS

| | | | |
|---|---|---|---|
| 6,677,772 B1 * | 1/2004 | Faull | G01R 1/06722 |
| | | | 324/755.05 |
| 2009/0243640 A1 | 10/2009 | Katsuma et al. | |
| 2016/0187382 A1 | 6/2016 | Campbell et al. | |
| 2017/0102410 A1 * | 4/2017 | Takesako | G01R 1/06794 |

FOREIGN PATENT DOCUMENTS

| | | |
|---|---|---|
| JP | H0680179 | 11/1994 |
| JP | 2010085292 | 4/2010 |

OTHER PUBLICATIONS

International Searching Authority, Search Report and Written Opinion issued in International Application No. PCT/HU2018/000001 (14 pgs.).

* cited by examiner

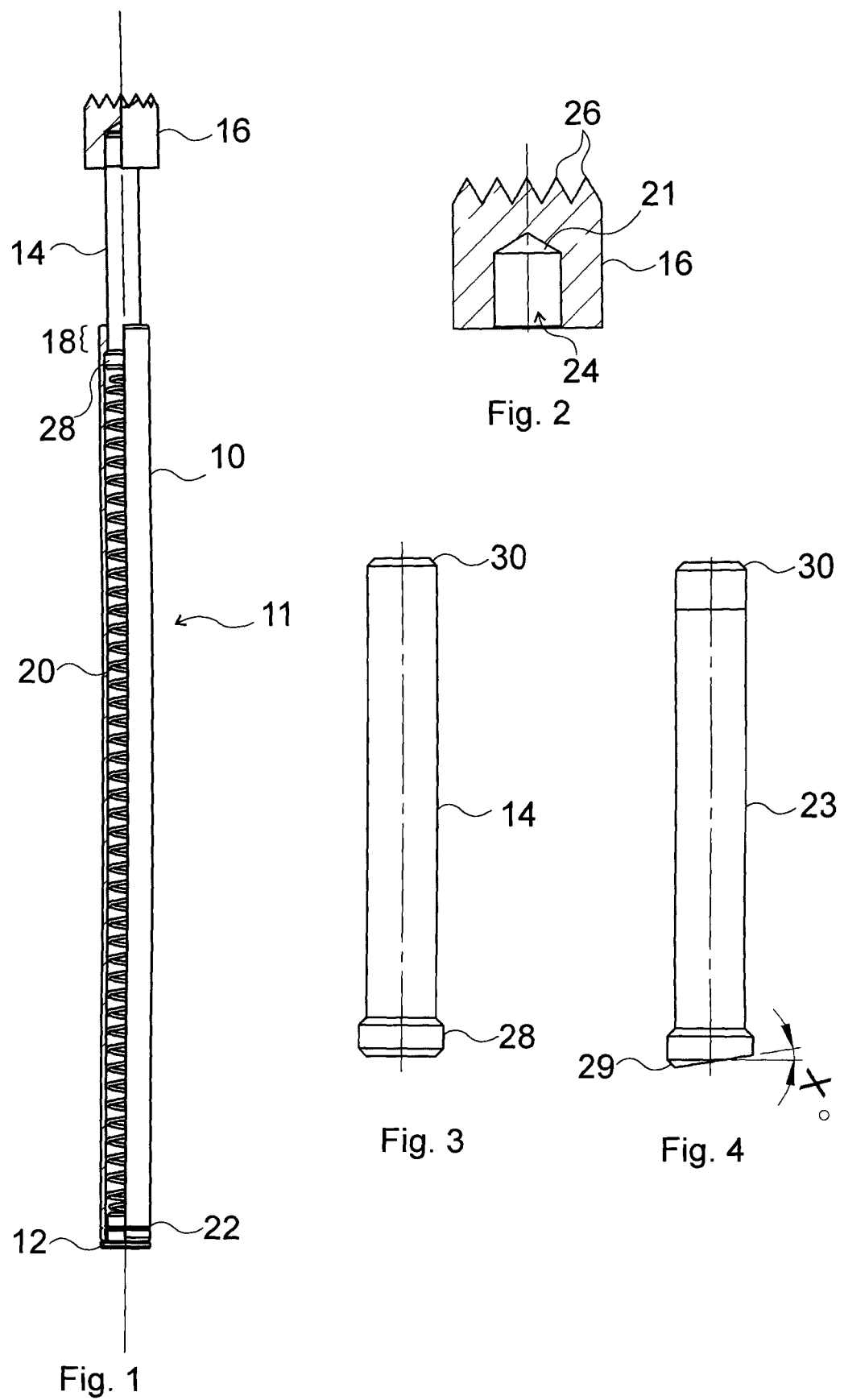

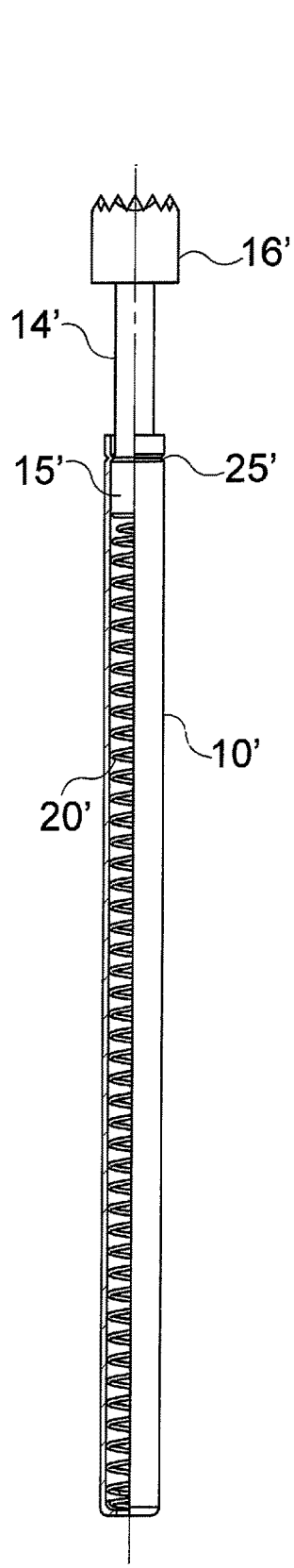
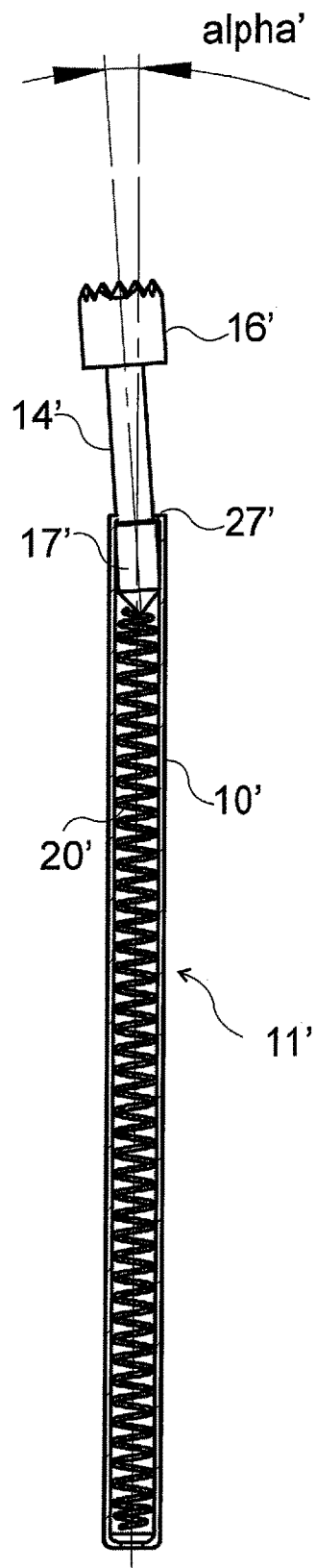
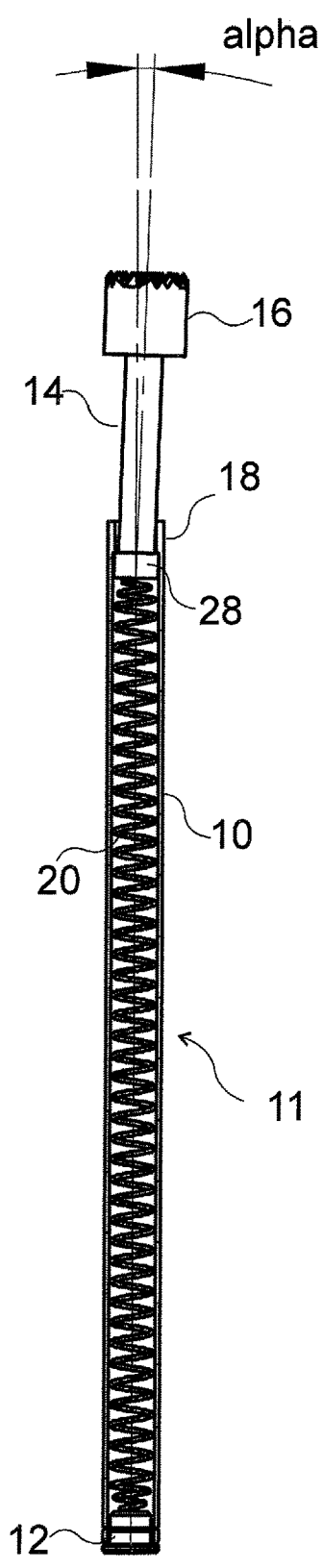
Prior Art
Fig. 13
Prior Art
Fig. 14
Fig. 15

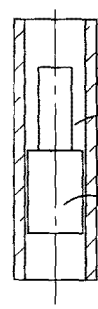
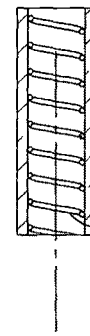
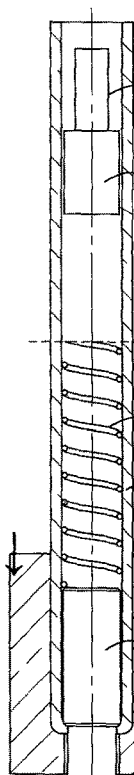
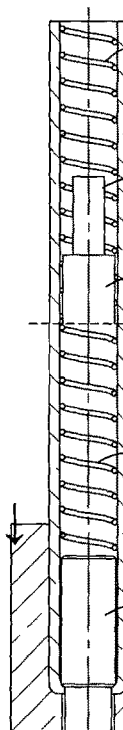
Fig. 29    Fig. 30

CONTACTING DEVICE, HEAD UNIT FOR THE SAME, AND METHODS FOR MANUFACTURING A CONTACTING DEVICE AND A HEAD UNIT

This application claims priority, under Section 371 and/or as a continuation under Section 120, to PCT Application No. PCT/HU2018/000001, filed on Jan. 22, 2018, which claims priority to Hungarian Application No. P1700051, filed on Feb. 2, 2017.

TECHNICAL FIELD

The invention relates to a contacting device suitable for measurements and/or other contact tests (such as a pin probe or switch probe), as well as to a head unit for a contacting device. The invention also relates to methods for manufacturing a contacting device and a head unit.

BACKGROUND ART

So-called pin probes and switch probes, collectively referred to as contacting devices, are utilized in many industrial fields, especially for testing printed circuits. The term "pin probe" is widely used in relation to these devices due to their elongated configuration (provided e.g. in order that as many of them as possible can be arranged beside one another for the analysis of a given surface area), and to their thickness being relatively small (typically lower than a cm).

Conventional pin probes that are widely available commercially consist of three components: an integrally made head unit (with a head and a plunger integral therewith), a body and a spring. Such a conventional pin probe is shown in FIG. 13; a resilient element 20' is arranged inner space of a tube element 10' (closed at one side) of the pin probe shown in FIG. 13. The resilient element 20' is biased by a plunger 14' inserted from the front into the tube element 10' (pin probe body), and the broadened portion 15' of the plunger 14' is supported against the resilient element 20'. A head 16' is made from one piece with the plunger 14'. For keeping the broadened portion 15' of the plunger 14' inside the tube element 10', the approach illustrated in FIG. 13, namely that a groove 25' is formed by pressing the material of the tube element 10' at the end of the tube element 10' being at the plunger 14', is widely applied in known solutions. As seen from the inside of the tube element 10' a protrusion is formed by the groove 25'; this protrusion prevents the broadened portion 15' of the plunger 14' from escaping from the tube element 10'. The diameter of a pin probe plunger is typically between 0.15 and 10 mm (though the latter value is applied in extreme cases only), and most frequently between 1-2 mm. The broadened portion of the plunger is approximately 10-30%, e.g. 15% wider than the remaining parts of the plunger. The diameter of the tube element receiving the broadened portion typically exceeds the diameter of the broadened portion by 10-30%.

The conventional pin probe, illustrated also in FIG. 13, is therefore assembled as follows. As a first step the spring is inserted into the pin probe body, i.e. it is pushed therein as far as the closed end of the pin probe body. Then, the plunger of the pin probe—made from one material piece with the pin probe head—is inserted into the body. Before closing-rolling the body, the spring is biased, followed by closing the pin probe body from the front applying rolling.

In certain pin probe types—as with the pin probe shown in FIG. 13—the head has a larger diameter than the plunger, so this type of pin can only be assembled from the front, i.e. the plunger can only be inserted into the pin probe body (tube element 10') from the front because otherwise it could not be passed through the tube element. The disadvantages of these known pin probes are the following:

- a large amount of waste material is generated when the plunger (configured integrally with the head element) is manufactured (i.e. during the machining/cutting operation), especially if a large-diameter head is needed;
- because the head unit (i.e. the unit comprising the head and the plunger) is made from large-diameter material, the duration of manufacturing (machining) is fairly long;
- there is market demand for many different head types; however, in case of an integral head unit keeping the various head unit types in stock involves high manufacturing and storage costs;
- when the conventional pin probe type shown in FIG. 13 is applied there is a danger that the probe (the plunger) escapes and causes an accident (even an eye injury) especially if a worn-out pin is not replaced in time;
- in the case of conventional pin probes the front of the pin is closed by rolling (the rolling operation is carried out as follows: the pin probe is rotated about its axis at a speed of 100-1000/min, and, approaching the probe from two opposite sides of the axis the wall of the tube element is indented, in circular fashion, utilizing the discs), which results in a larger gap being formed between the plunger of the pin probe and the body (tube element) of the pin probe, allowing the pin (plunger) to be displaced from the axial direction (tilting to the side), which may lead to testing errors in the case of smaller test points as the test points cannot be hit precisely by the head (head element), preferably a protruding tip, spike thereof;
- the above described conventional pin probe causes a high electric resistance, since the contact surfaces between the pin probe body and the pin probe plunger are small, the electric current will practically be carried by the resilient element (spring), as it is in constant contact with the plunger, which has a conductivity limited by its mechanical dimensions; the current carrying function of the pin probe body (the wall of the tube element) is reduced due to the relatively small (and, in some cases, unreliable, movable) contact surface between the plunger and the pin probe body;
- in the case of conventional pin probes it is not economical to keep in stock a small number of probes (the price of low quantities probes may rise as a result of that);
- due to the applied (appropriate) tolerances and to their method of assembly the conventional pin probes exhibit greater "wiggle" (as illustrated in FIG. 14), have high internal resistance, and can only transfer low currents; the "wiggling" may lead to unpredictable, unreliable electrical measurements;
- the (not very accurate, incidently implemented) mechanical guiding applied in the conventional pin probes leads to wear and tear in a short period of time, which further increases "wiggle" (play) and shortens the replacement cycle of the probes because they become incapable of hitting the test points; this may lead to additional costs.

In GB 2,347,023 A a spring measurement device is disclosed which is adapted for providing electrical contact at both sides and is applicable for testing semiconductors (e.g. a microcontroller). In the arrangement according to the document the measurement devices are arranged between two embracing plates such that their protruding ends are arranged in a matrix-like fashion. The measurement device comprises two partial devices slid into one another, the spring being introduced between respective broadened portions of the partial devices; in addition to that it is also ensured by the broadened portions—by abutting against the embracing plates—that the partial devices cannot get out of the region between the embracing plates. The two partial devices slid into one another are therefore pressed against the embracing plates by the spring, and, when the respective pointed portions (head elements) of the partial devices protruding from the embracing plates are subjected to an appropriate-direction force they are pressed inward between the plates.

In a variation (FIG. 12) of the technical approach of GB 2,347,023 A the head element and broadened portion of the partial device forms an integral part (essentially a head unit) that is made separately from other portions of the partial device facing the other partial device. The separate sections are interconnected either by means of a pin and a bore, e.g. utilizing screw thread, pressing them together, or crimping. This separate-piece configuration is applied in order that the portions of the partial devices without head units can be interconnected (e.g. by crimping); subsequently the spring can be pulled on the interconnected portions; the broadened portions sandwiching the springs (or one of them) is attached only after that. This assembly sequence is applied because if the broadened portions sandwiching the spring would be present during crimping then also the spring would have to be pulled on the portions to be crimped (because it would be impossible to do that later). Thus, the spring would hinder the crimping operation and for example it would have to be kept down in a separate step such that the interconnection can be made utilizing the crimping tool.

In the technical approach described in GB 2,347,023, however, the broadened portion is kept inside the region encompassed by the two plates, and so the component of the partial device attached later cannot leave the region encompassed by the two plates even in the event that the interconnection fails.

A further contacting device adapted for measurement and testing purposes is disclosed in CH 642 489. The plunger of the contacting device according to the document is flexible (bends when it is touched on an obstacle, see FIG. 2 of the document) and can be passed through the opening through which it extends from the body (the protruding end of the plunger is narrower than the body). A spring is arranged inside the body of the contacting device between the thickened (broadened) portion of the plunger and the end of the contacting device laying opposite the end where the plunger extends from the body.

In US 2007/0296436 A1 it is mentioned that the plunger of the contacting device (and therefore also the head made integral therewith) is made, by way of example, of palladium.

In DE 83 30 915 U1 a contacting device is disclosed in which a head is connected by welding to the plunger at the outside end thereof. Welding is also applied for closing the body of the device. A huge disadvantage of welding is that making high-precision welds is cumbersome, especially in the case of pin probes having plungers with smaller diameter (of maximum a few millimetres). Another drawback is that the barb possibly produced during welding can alter the characteristics of the device.

A welded connection of the head element of the contacting device is suggested also in DE 87 01 205 U1. Alternatively, the head element is connected to the element circularly encompassed by a spring with a releasable connection.

A plunger with an end portion oriented at an angle different from 90° with respect to the longitudinal axis of the plunger (a plunger with an inclined end portion) is disclosed in U.S. Pat. No. 6,464,511 B1.

Other known contact probes (contacting devices) are disclosed in U.S. Pat. Nos. 4,787,861, 5,004,977, 5,045,780, US 2003/0134526 A1, US 2007/018666 A1, US 2009/243640 A1, US 2016/187382A1, US 2008/0122464 A1, DE 26 57 016 A1, DE 33 40 431 A1, DE 40 40 312 A1, DE 84 17 746 U1, JP H06 80179 U, JP 2002202323 A2, JP 2010 085292 A.

In light of the known approaches the need has arisen for a contacting device and a head unit for the same, as well as for a method for manufacturing the device that allow for manufacturing the contacting device, and particularly the plunger thereof forming a part of the head unit, more economically and with lower material consumption for the same plunger diameter.

DESCRIPTION OF THE INVENTION

The primary object of the invention is to provide a contacting device, a corresponding head unit and a method for manufacturing the same which are free from disadvantages of prior art approaches to the greatest possible extent.

A further object of the invention is to provide a contacting device and a head unit for the same, as well as a method for manufacturing the device that allow for manufacturing the contacting device, and particularly the plunger thereof forming a part of the head unit, more economically and with lower material consumption for the same plunger diameter.

Still further object of the invention is to widen the range of applicable materials, and to render it more economical, compared to known solutions, to manufacture contacting devices or head units in relatively low quantities.

The objects of the invention can be achieved by the contacting device according to claim 1 and the method for manufacturing a contacting device according to claim 7. Preferred embodiments of the invention are defined in the dependent claims.

In the technical field of the invention no solutions applying press fitting or shrink fitting connections have been provided so far due to technical limitations. Such modes of interconnection were for a long time inapplicable for components with the dimensions characteristic of pin probes (e.g., for very slender pin probes with a thickness of a few mm-s), but they have now been made available for use by today's technology. The contacting device according to the invention has the following exemplary dimensions: the diameter of the pin probe body (i.e. the outer diameter of the tube element) is typically between 1.5 and 4.0 mm, with the length of the fully assembled test probe being typically between 30 and 40 mm.

As detailed herebelow, the interconnection of the head element and plunger by press fitting or shrink fitting in the contacting device has a number of advantages (e.g. reducing the amount of waste material). By extensive testing we have established that the contacting device according to the invention preferably has a long service life, and particularly preferably allows the application of extremely durable materials (e.g. palladium alloy) in the head element.

BRIEF DESCRIPTION OF THE DRAWINGS

Preferred embodiments of the invention are described below by way of example with reference to the following drawings, where FIG. 1 is an exploded view illustrating an embodiment of the contacting device according to the invention, FIG. 2 is a sectional drawing of the head element applied in the embodiment of the invention according to FIG. 1, FIG. 3 is a spatial view of the plunger applied in the embodiment of the invention according to FIG. 1, FIG. 4 is a spatial view of the plunger in another embodiment of the invention, FIG. 13 is an exploded view illustrating a prior art contacting device, FIG. 14 is an exploded view illustrating a prior art contacting device, FIG. 15 is an exploded view illustrating the contacting device according to an embodiment of the invention FIGS. 25-33 are drawings illustrating an embodiment of the method for manufacturing a contacting device according to the invention.

MODES FOR CARRYING OUT THE INVENTION

Figure 5:
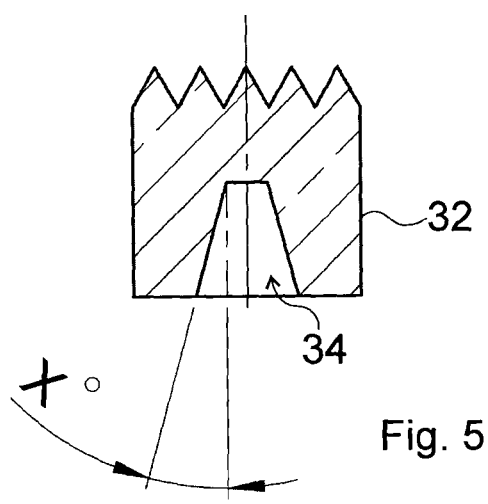
FIG. 5 is a sectional view of the head element in a further embodiment of the invention.

In FIG. 1 an embodiment of the contacting device according to the invention (that is, a pin probe, i.e. a measurement device 11 having a movable plunger adapted to perform measurements) is shown. The measurement device 11 comprises a head unit (head module) comprising a plunger 14 (stem, shaft) having a broadened portion 28 at its first end, and a head element 16 being at a second end of the plunger 14. The term "head unit" is therefore used herein to refer to the unit which comprises the head element and the plunger. The measurement device 11 further comprises a tube element 10 (barrel) having a third end and a fourth end opposite the third end (these are a guiding end 15 and a feeding end 17 in the present embodiment, see FIG. 10), receiving the broadened portion 28 of the plunger 14 at the third end, and keeping the broadened portion 28 in its inner space by means of an inward-projecting (inward-extending) flange portion (part; here a guiding flange portion 18 is formed previously but in other embodiments an inward-projecting flange portion, such as the groove 25' as seen in FIG. 13 may be formed subsequently (posteriorly)) arranged at the third end, and a resilient element 20 being arranged in the inner space of the tube element 10m being supported against the end portion of the broadened portion 28 and against the closed fourth end of the tube element 10 (here the closed end is made by a plug element 12; in embodiments utilizing frontal assembly the closed end can be closed already when manufactured). According to FIG. 1 (and subsequent figures) the plunger 14 is therefore arranged such that its first end, provided with the broadened portion 28, extends (reaches) into the tube element 10 (it is retained in the inner space by the flange portion); depending on the biasing of the resilient element 20 the narrower part of the plunger 14 also enters the inner space of the tube element 10 to some extent, and the remaining portion of the plunger 14 projects (extends) out from the tube element 10. The tube elements illustrated in the figures have a straight configuration. In the contacting device according to the invention the head element and the plunger are typically rigid, and the volume of the plunger, i.e. the amount of material required is typically at least 2-3 times, optionally at least 10 times larger than the volume of the head element.

The plunger applied in the contacting device according to the invention preferably has an oblong shape (essentially, a rod shape), the broadened portion (extending into the tube element) being formed at the first end of the plunger; this end can be called the "clamped end", or the end at the tube element. The other end of the plunger is the second end to which the head element is connected; this end can be termed the "head end" or the end facing the head element.

The tube element is a tube-shaped element having a wall and an inner space enclosed by the wall (it does not necessarily have an exactly circular cross section, however, a circular cross section is preferred), and two ends. One end may be closed already when manufactured, or can be closed e.g. by means of a plug element (in this latter case in an embodiment of the invention this end functions as a feeding end). The other end is adapted for guiding the plunger, with a flange portion being formed on this end in order to prevent the broadened end of the plunger from leaving the inner space of the tube element. The two ends of the tube element may be called first end and second end (or, according to the numbering applied in the claims, third and fourth end).

Figure 12:
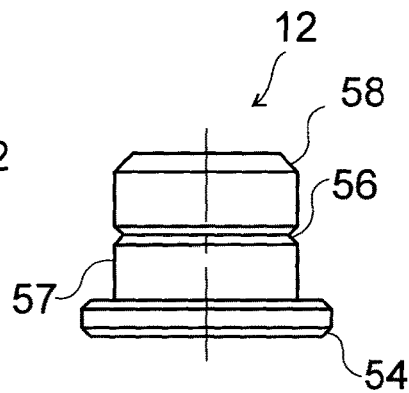
FIG. 12 is a spatial view of a plug element applied in an embodiment of the invention.

In the embodiment of FIG. 1 the closed end of the tube element 10 is prepared applying a plug element 12 for closing the end of the tube element 10 situated opposite the plunger 14. As it is described below, this end of the tube element 10 is closed only after having introduced the plunger 14 inside the tube element 10 through it. In FIG. 1 a groove 22 formed by pressing is also shown. As it is illustrated in FIG. 12, a groove 56 is arranged in the wall of the plug element 12; the groove 22 (i.e. the interconnection between the plug element 12 and the tube element 10) can be formed by pressing, at an appropriate location, the wall of the tube element 10 into this groove 56.

The inward-projecting flange portion is preferably a guiding flange portion 18 adapted for guiding the plunger 14, and therefore it provides a relatively large contact surface between the tube element 10 and the plunger 14, but the flange portion may also be implemented as a inward-projecting rim that can be formed by way of example at the time the corresponding part of the head unit, i.e. the broadened portion of the plunger, is introduced into the tube element from the front.

In the illustrated embodiment of the contacting device according to the invention, therefore, the second end of the plunger 14 projects out (protrudes) from the tube element 10 in case the broadened portion 28 is abutted against the flange portion 18 (that is, when the broadened portion 28 comes into contact with, i.e. becomes supported against the flange portion 18), and the head element 16 and the second end of the plunger 14 are connected to each other by means of shrink fitting (shrink joining) or press fitting. Thus, in the contacting device according to the invention, the second end of the plunger projects (extends) out from the tube element, when the broadened portion is supported against the guiding flange portion (or against a flange portion configured otherwise). The plunger is typically urged into this state by the resilient element in the case wherein the head unit is not pressed inward, i.e. this is the base state of the plunger.

Accordingly, in the contacting device according to the invention the head element is connected, by means of press fitting or shrink fitting, to the end of the plunger that projects out from the tube element. As it was mentioned above, in the technical approach disclosed in GB 2,347,023 A, such a part is posteriorly (subsequently) connected to the partial device that remains sandwiched between the embracing plates all the time, i.e. it can only projects out from the device but cannot get out therefrom in accordance with the arrangement of the broadened portion being on the subsequently attached component.

In contrast to that, according to the invention the component attached to the plunger (the head element) is connected to the end of the plunger that projects out from the tube element when abutted against the flange portion (in the base state). Two cases can be distinguished as far as the subsequently attached head element is concerned.

1. If the head element is not wider (as measured perpendicular to the axial direction, i.e. the direction of movement of the plunger) than the guided portion of the plunger projecting out and the resilient element can be compressed to a sufficient amount, then the head element can (partially) enter (be pressed into) the tube element (such a full depression of the head element does not typically occur in measurements, and an excessive depression can be prevented by way of example by the appropriate dimensioning of the resilient element).

2. If the head element has a larger width (as measured perpendicular to the axial direction, i.e. the direction of movement of the plunger) than the projecting out guided portion of the plunger, then the head element cannot enter the tube element but instead it is abutted against the third end of the tube element.

Thus, opposite to the above described known approach, the subsequently attached head element is not protected, with the help of another component (like the edge of the embracing plate in the known approach)—by way of example by abutting against it—against leaving the device. Such a protection is required in the known approach. However, our experiments indicated that the connection between the plunger and the head element can be made by shrink fitting or press fitting at such a high quality that the probability of the connection being released at a later time can be reduced to zero to a very good approximation, that is, the chance of an accident (i.e. that the head element leaves the plunger) practically can be neglected, and thus the advantages of the interconnection according to the invention can be utilized.

According to the above, the head unit (the head element and the plunger) of the invention is not made from one piece but interconnected by shrink fitting or by press fitting. Connections made by shrink fitting and by press fitting are long-term, permanent joints optionally involving deformation of the components; applying such connection mode it can be provided that the head element is fixed firmly at the second end of the plunger. If a connection by shrink fitting is made applying a sufficient amount of heating at the receiving portion (e.g. at the head element comprising the bore) the other part (e.g. the plunger) can be slid into the receiving portion in the heated-up state. A lower amount of heating may also be satisfactory, in which case the other portion can be introduced into the receiving portion applying a pressing force. It is typically required to heat the components to a few hundred centigrades; the exact temperature depends on the applied materials.

Accordingly, it becomes preferable that, instead of retaining the broadened portion by means of the rim-like flange portion, a guiding flange portion 18 (with a length of 0.5-5 mm, typically 2-3 mm) is applied. Applying a guiding flange portion is more preferable due to its conductive properties. In known approaches the inclusion of the flange portion was required in order that the known contacting device can be assembled from the front; because the rim-like flange can be formed after completing assembly. It is not possible to form the guiding flange portion (see e.g. the guiding flange portion 18) preferably applied according to the invention after assembling the device (although the known tube element can in principle be flattened along a longitudinal section but that way it would be practically impossible to provide the appropriate contact—a contact of a quality similar to the one made applying the guiding flange portion—between the plunger and the tube element). The length of the guiding flange portion is at least ⅔ of the diameter of the plunger portion guided by it (i.e. of the non-broadened portion).

Figure 10:
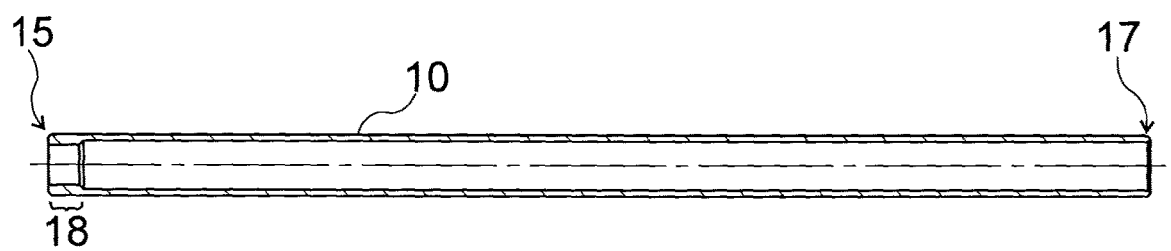
FIG. 10 depicts in sectional view the tube element in an embodiment of the invention with open ends.

It therefore becomes possible to apply the guiding flange portion (e.g. a flange portion 18), i.e. a contact portion with greater length, provided that the head element and the plunger of the contacting device are formed from two separate pieces after the plunger has been introduced into the tube element from the rear (i.e. not at a guiding end 15 of FIG. 10 but at a so-called feeding end 17). Thereby the broadened portion of the plunger need not pass through the flange portion. In this embodiment, therefore, the head element is applied to the plunger when the plunger has already been passed through the flange portion. In this case the feeding end of the tube element is closed afterwards (subsequently).

The embodiment illustrated in FIG. 1 is also configured along the same principles. In this embodiment the fourth end of the tube element 10 is closed after introducing the plunger 14 into the inner space of the tube element 10 with its fourth end and after arranging the resilient element 20 (i.e. the plunger 14 is introduced into the tube element 10 from the rear, followed by introducing, also from the rear, the resilient element 20 and then forming the closed end), and the head element 16 and the second end of the plunger 14 are connected to each other after passing the second end through the third end of the tube element 10 (that is, the plunger 14 is passed through the guiding end 15—from the direction of the opposite end of the tube element 10—, and then the head element 16 is connected to the second end of the plunger 14). The embodiment of FIG. 1 is an embodiment of rear assembly; in this embodiment—since there is no need to form the flange portion posteriorly (subsequently)—the flange portion can be implemented in a carefully pre-designed manner, preferably as a guiding flange portion.

In the case of rear assembly it is particularly preferable that the head element is connected only after passing the plunger through the tube element and passing the second end thereof through the third end of the tube element. This advantage manifests itself especially when the head element is wider than the opening of the third end. At the same, the advantage that the applied head element can be chosen freely (a narrower or wider one) exists also when such a head element is applied which is narrower than the opening of the third end (in that case the head element could be passed through the flange portion), that is—advantageously from the aspect of economy—the same assembly method can be applied irrespective of the exact type or dimensions of the head element to be attached.

Implementing the plunger and the head element as separate components connected to each other by shrink fitting or press fitting has the added advantage compared to the widely applied known approaches that the head unit can be made with relatively less waste material, because according to the invention the plunger and the head element are formed from two distinct pieces of material. The size of the initial pieces of material can be selected individually for the elements (separately for the plunger and for the head element), so the size difference between them (i.e. with circular cross-section pieces, the difference in diameter) which in many cases is very high does not result in a high amount of waste material when the pieces are machined.

This configuration preferably also allows that the head element and the plunger can be formed from two different materials. For manufacturing contacting devices, by way of example, pin probes it is especially preferable to apply palladium or palladium alloy materials. According to the known approaches, however, manufacturing an integral head unit (head element and plunger) from a palladium alloy involves costs that are prohibitive for the market adoption of devices made of such materials. In contrast to that, according to the invention it is feasible to manufacture only the head element from palladium alloy (since from the aspect of making the contact only the material properties—i.e. appropriate hardness—of the head element are significant), the head element being subsequently attached to the plunger at a later stage of manufacturing. Instead of palladium alloy, in this case the plunger is made from a more cheaply available material with appropriate characteristics.

Therefore, in contrast to the teaching of US 2007/0296436 A1 representing the prior art, in the invention the head element and the plunger can be preferably made of different materials. By specifying the material of the plunger, in US 2007/0296436 A1 the material of the entire head unit is specified because it is made from one piece (see e.g. FIG. 3). However, manufacturing the entire head unit from palladium (palladium alloy) would involve so high a cost that in practice such test probes cannot be applied economically. Conversely, the invention allows for manufacturing only the head element of the preferably applicable palladium or palladium alloy materials, while the plunger is made from a different material. The invention therefore allows for the economical application of palladium.

In an embodiment of the invention, therefore, the head element is made of palladium alloy, and the plunger is made of a material different from palladium alloy. It is preferable also to apply such a palladium alloy which comprises an arbitrary—even very low—amount of palladium, but more preferably such a palladium alloy is applied that comprises at least 20 weight % of palladium, and in the remaining at most 80 weight % other materials, such as silver and copper. More preferably, such a palladium alloy is utilized that, besides other alloying materials, comprises more than 30 weight % of palladium. Particularly preferably, such a palladium alloy is utilized that, in addition to other alloying materials comprises approximately 35 weight % of palladium. For example, such a palladium alloy can be applied which comprises, either exactly or to a good approximation, 35 weight % of palladium, 35 weight % of silver, and 30 weight % of copper (35Ag-35Pd-30Cu). The palladium content of the applied alloy preferably does not exceed 60 weight % because otherwise the manufacturing costs of the head element would be very high, and it would be almost impossible to machine by cutting.

Since in case the device according to the invention it is possible to make only the head element of palladium alloy or some other advantageous material (independent of the plunger), the contacting device according to the invention allows for a wider range of applicable materials, and renders it more economical than with known solutions to manufacture contacting devices or head units in relatively low quantities. The device according to the invention also makes it possible that after manufacturing a large number of plungers various kinds of heads can be attached to them; at this stage only the head elements have to be made for producing the head units.

In an embodiment the contacting device according to the invention comprises, for connecting the head element and the plunger to each other by shrink fitting or by press fitting, a connection element being arranged on one of the plunger and the head element, and a connection bore being arranged on the other of the plunger and the head element, and being adapted for connecting to the connection element. The connection bore is a cavity that is typically open at one end and is formed for example by a drill or a similar tool, or, for example in the case of a plastic component the whole component can be made such that the bore is included therein already when manufactured. The connection element is a protruding component (e.g. a pin, stud, or plunger end, see below) that can be inserted into and attached to the connection bore.

In this embodiment of the invention therefore the head element and the plunger are connected to each other by shrink fitting or press fitting, via the connection element and the connection bore. In the overwhelming majority of the illustrated embodiments the connection element is implemented on the plunger by the end of the plunger itself (the second end of the plunger functions as a connection element), and the connection bore is formed in the head element (sunk into the head element); in some embodiments however (e.g. the embodiments of FIGS. 18, 19 and 24) the connection element is formed on the head element, and a connection opening is formed in the plunger. Such an embodiment can be conceived wherein there is a connection element and a connection bore on the plunger, a corresponding (matching) connection bore and connection element is arranged on the head element.

The embodiment illustrated in FIG. 1 is such an embodiment; in this embodiment the second end of the plunger (the end facing the head element) functions as a connection element, i.e. it is configured as a connection element. As it is described in detail below, in the embodiment of FIG. 1 the connection bore is formed in the head element. There are of course such embodiments (see the embodiments of FIGS. 18, 19) wherein the connection bore is formed in the plunger, and either the end of head element facing the plunger functions (is configured) as a connection element, or the connection element is formed at the end of the head element facing the plunger.

In FIG. 2 the head element 16 applied in the embodiment of FIG. 1 is shown. The head element 16 comprises a connection bore 24. At the end situated opposite the connection bore 24 the head element 16 comprises a contacting portion 26 that in this embodiment is implemented as several pins of equal height. As it is illustrated by FIGS. 18-24 and FIGS. 35-42, with the head elements utilized according to the invention the contacting portion can be implemented in essentially any manner.

The connection bore 24 of the head element 16 comprises—as shown in the sectional drawing—a cylindrical region that is terminated by a conical region 21 at the inside of the head element 16. The conical region 21 can also be configured to be flatter in proportion to the connection bore 24. The purpose of arranging the conical region 21 is to provide an additional region for receiving a volume of air that cannot escape anywhere else during the press fitting/shrink fitting process. After connecting the plunger, this volume of air is received in a compressed state in the conical region 21.

FIG. 3 shows a view of the plunger 14; in the figure a second end 30 of the plunger 14 and also the broadened portion 28 are also shown. FIG. 3 shows that at its second end 30 the plunger 14 has a frustoconical portion that has a very short length relative to its diameter. This frustoconical portion facilitates the insertion of the plunger 14 into the connection bore 24.

In FIG. 4 a plunger 23 being very similar to the plunger 14 is shown. The plunger 23 differs from the plunger 14 in that instead of a broadened portion 28 it has a broadened portion 29 having an end portion that (the plane thereof) lies at an angle of other than 90° with respect to the axis of the plunger 23, i.e. the end portion is cut slantwise. The plane of the end portion typically lies at an angle of 45-85°, preferably at 70-85° with respect to the axis of the plunger (extremely low values such as 45° can expediently be selected for example for high-current applications, in this and other cases the axial dimension of the broadened portion 29 measured along the plunger axis can be longer than depicted in the drawing); accordingly, in FIG. 4 the angle x between a plane perpendicular to the axis and the plane of the end portion is 5-45°, preferably 5-20°. When such an end portion is applied, due to the tilting of the plunger 23 by the resilient element 20 an increased connection surface area is provided between the tube element and the plunger 23, resulting in that current is now carried not only by the resilient element connecting the plunger. As a result the contacting device, e.g. measurement device, can carry a higher current with the specific resistance of the measurement device being reduced, and thus the service life of the measurement device can be extended.

According to the invention the plunger 14 or 23 can be connected to the connection bore 24 illustrated in FIG. 2 in two ways: by shrink fitting or by press fitting (for example, by the so-called cold press fitting). These two types of interconnection are identical in that the connection element (that is, e.g., the corresponding end of the plunger to be connected) has a larger cross section (i.e. in case of a circular cross section, larger diameter) than the connection bore (connection indentation). As far as the diameters (effective diameters) are concerned this preferably means that the diameter (effective diameter) of the plunger is at least 0.5% and at most 2% larger than the diameter (effective diameter) of the connection bore. That is, if, for example, the diameter of the plunger at the end to be connected (second end) is 2 mm (with a tolerance of 0.01 mm), then the bore has a diameter of 1.98 mm (with a tolerance of 0.01 mm).

In the case of shrink fitting, therefore, there is a so-called overcovering, i.e. the diameter of the plunger is initially larger than the diameter of the connection bore formed in the head element. In this embodiment, therefore, the head element is connected to the second end of the plunger by shrink fitting, applying a second plunger end with a larger diameter than the diameter of the connection bore of the head element that is adapted to match the shape of the plunger and to provide connection to the plunger. Furthermore, in this embodiment the head element is heated during the shrink fitting process to achieve such an expansion that the second end of the plunger can be introduced into the connection bore, and the second end of the plunger is then introduced into the connection bore of the head element.

Preferably, a lower amount of heating has to be applied in the case wherein for the introduction into the connection bore the second end of the plunger is cooled simultaneously with heating the head element. This is because in this case the second end of the plunger undergoes contraction, and as a result of that—and not only as a result of the heating of the head element—the size difference between the plunger and the connection bore is reduced. In order that shrink fitting can be applied, such materials have to utilized for manufacturing the head element and the plunger which undergo thermal expansion as a result of heating and contraction as a result of cooling. Accordingly, the head element and the plunger are preferably made of metal. By way of example, the following pairings can be applied (of course a number of other combinations can also be utilized):

TABLE 1

| Plunger | Head element |
|---|---|
| brass | brass |
| steel | steel |
| steel | palladium alloy |
| steel | plastic |
| plastic | metal |
| copper beryllium | steel |
| bronze | palladium alloy |
| brass | palladium alloy |
| bronze | bronze |
| copper beryllium | copper beryllium |
| brass | copper beryllium |
| brass | bronze |

The materials listed in Table 1 are applicable with shrink fitting, as well as with connection by press fitting or cold press fitting.

In case of shrink fitting the interconnection (assembly) of the components (plunger, head element) is therefore performed by heating the head element (i.e. the component to be expanded from the two component) such that the diameter of the connection bore thereof is larger than in the initial state, and, optionally, cooling the plunger such that the plunger and the head element can be fitted together without applying a pressing force.

The components illustrated in FIGS. 2-4 can also be interconnected by press fitting without heating, i.e. without a temperature difference between the components, by means of the so-called cold press fitting. During cold press fitting the surface pressure—distributed evenly along the surfaces in contact—is made use of. For example, in the case of a circular cross section the component to be pressed has to be placed on the bore into which it is to be pressed in a circular symmetrical fashion, i.e. it has to be ensured that the overhang is essentially the same along the entire circumference. In this case the assembly (interconnection) is performed essentially by press fitting, such that a plunger with a cross section (diameter) larger than the cross section of the bore formed in the head element is applied. The pressing force preferably has an axial direction, i.e. it is aligned with the axis of rotation or axis of symmetry of the plunger.

During the connection process the head should of course be supported such that in does not move during press fitting.

Figures 6, 7:
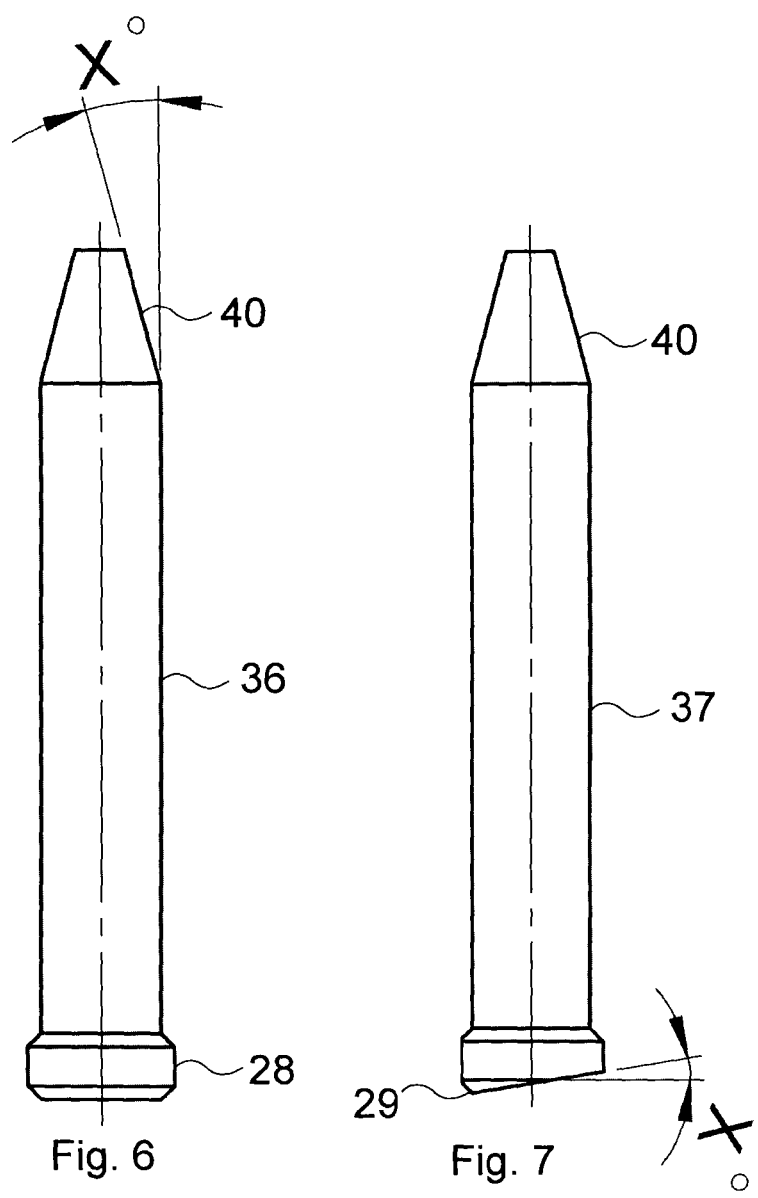
FIG. 6 is a spatial view of the plunger in a further embodiment of the invention.
FIG. 7 is a spatial view of the plunger in a still further embodiment of the invention.

In FIG. 5 a further head element 32 comprising a connection bore 34 is shown. The half cone angle of the connection bore (the angle between the cone surface and the line perpendicular to the base of the cone) is x [°]. The plunger 36 applicable with the head element 32 of FIG. 5 is illustrated in FIG. 6. The plunger 36 has a conically narrowing second end 40 and a broadened portion 28. The second end 40 is fitted into the connection bore 34, and by means of these the head element 32 and the plunger 36 can be interconnected, in particular by a self-locking (conical) connection.

The mode of action of the self-locking connection is the following. Due to the mantle ascent of the interconnected cone surfaces an adherence joint is formed between the head element and the plunger as a result of the pressure force because of the friction, and thereby the head element fixes to the plunger. In order that a self-locking connection can be formed, the half cone angle values have to be preferably under 1.5°; by way of example the cone ratio is 1:20, with a corresponding half cone angle of 1.43°.

The self-locking connection is achieved by press fitting, i.e. in the embodiments applying self-locking connection the side wall of the connection element (i.e. for example the corresponding end of the plunger) and the connection bore is conical or frustoconical, the half cone angle of the connection element and the connection bore is preferably smaller than 1.5°, and the head element and the plunger are connected to each other by press fitting. A plunger having a second end with a frustoconical shape is preferably connected to a frustoconical connection bore, it can however also be connected to a conical bore. A conical plunger is to be attached to a conically shaped connection bore. Of course, the half cone angles of the two interconnected devices are identical to a very good approximation, and the self-locking connection can be established by applying a given pressure force.

If a conical end is applied, i.e. self-locking is to be implemented, it is still expedient to allow a certain amount of tolerance, by way of example approximately according to the above described example. In that case, the effects of pressing will also apply in addition to self-locking (a so-called "double locking" will be established). The lower the half cone angle, the less conical, i.e. the straighter, is the plunger; and, since the self-locking effect becomes weaker and weaker, the tolerances applied also in relation to press fitting will play an increasing role.

In FIG. 7 a plunger 37 is shown, which differs from the plunger 36 in that instead of a broadened portion 28 comprising a flat end it has a broadened portion 29 that—as with the plunger 23 according to FIG. 4—has an end portion of which the plane lies at an angle of other than 90° with respect to the axis of the plunger 37.

Figure 8:
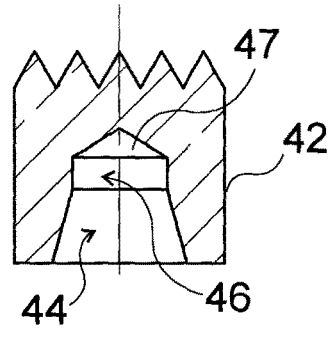
FIG. 8 is a sectional view of the head element in a still further embodiment of the invention.

In FIG. 8 a further head element 42 comprising a connection bore 44 adapted for providing a self-locking connection of the second end of a plunger is illustrated. A cylindrical region 46 and an adjacent conical spatial region 47 are situated at the end of the bore 44 facing the interior of the head element 42. The purpose of including spatial regions 46 and 47 is that they provide further space for the pressed-in plunger that is thereby connected along the wall of the bore 44 in a self-locking manner, its preferably conical end projecting into the spatial regions 46 and 47. The spatial regions 46 and 47 are available for air to enter therein during the press fitting; if air cannot be expelled from the bore 44 during press fitting it can be compressed inside the remaining volume (i.e. the volume left by the inserted plunger) of the regions 46 and 47.

Figure 9:
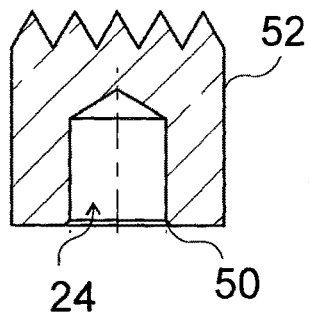
FIG. 9 is a sectional view of the head element in an embodiment of the invention.

In FIG. 9 a head element 52 is illustrated that is configured similarly to the head element 16 of FIG. 2. The only difference of this embodiment from the head element 16 is that in this embodiment a circularly extending edge-smoothing 50 is formed, adapted for facilitating insertion, at the inlet of the connection bore 24. The edge-smoothing 50 is arranged in a circular fashion in the wall of the head element 52 on the underside of the head element 52 (i.e. on the side on which the connection bore 24 is situated). By widening the inlet of the connection bore 24 the edge-smoothing 50 facilitates the interconnection process by shrink fitting or by press fitting applied with the head element 52, more particularly the introduction of the plunger to be connected into the connection bore 24.

Figure 11:
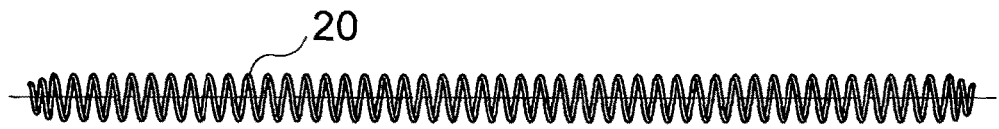
FIG. 11 is a spatial view of the contacting device according to the invention in an embodiment of the invention.

In FIG. 10 the tube element 10 is shown. In FIG. 10 the guiding end 15 and the feeding end 17 of the tube element 10 are marked. In the figure the guiding flange portion 18 can be seen that is arranged at the guiding end 15 and is adapted for guiding the plunger inside the tube element 10. In FIG. 11 the resilient element 20 is shown that in this embodiment is implemented as a helical spring.

FIG. 12 shows a spatial view of the plug element 12. The plug element 12 has a closing rim 54 with a diameter that is larger than the diameter of a plug portion 57 connected thereto. During the insertion of the plug element 12 the spring portion 57 is introduced into the feeding end 17 of the tube element 10, and the closing rim 54 seats against the end of the tube element 10. In FIG. 12 a groove 56 (connection recess) is shown that in this embodiment is arranged circularly around the plug portion 57, perpendicular to the axis of symmetry of the plug element 12. The plug element 12 has a frustoconical end 58, the end 58 is configured such that it facilitates the insertion of the plug element 12 into the tube element 10. The plug element 12 is rotationally symmetrical in accordance with the tube element 10 preferably having a circular cross section in the illustrated embodiment; a number of other components are also configured in a rotationally symmetrical or more or less rotationally symmetrical way (for example, the head element may have a spike arrangement that is not rotationally symmetrical but the other portions of the head element, i.e. its main body are). Due to the rotationally symmetrical configuration of the tube element 10 the flange portion 18 is a cylindrical guiding flange portion adapted to cylindrically encompass the plunger after assembly.

As with FIG. 13 described above, in FIG. 14 a measurement device 11' is shown also from the prior art, while FIG. 15 illustrates the measurement device 11 shown also in FIG. 1. Comparing FIGS. 14 and 15 it can be learned how big a difference in the operation of the devices can be made by applying the rim-like flange portion 27' (widely utilized in known solutions) and the flange portion 18 providing axial-direction guidance for the plunger. These operational differences are illustrated by the deflection angles alpha' and alpha indicated in FIG. 14 and FIG. 15, respectively. Also, comparing FIGS. 14 and 15 it can be clearly seen that the rim-like flange portion 27' does not provide the same degree of lateral support (guiding) as does the guiding flange portion 18 that can be applied in the invention due to the selectable rear assembly method, and thus the deflection angle alpha' that can be measured in the known solution is much larger than the deflection angle alpha typical of an embodiment of the invention.

The configuration of the measurement device 11 according to the invention allows for reducing the applied tolerances (the retaining flange is preferably formed in advance rather than with a tool after assembling the device) compared to the known and widely applied measurement devices; this also helps to form an increased contact surface area between the plunger and the tube element, especially if a guiding flange portion is applied. The reduced "play" helps to hit the test points more accurately.

It is noted that the plunger 14' and head element 16' shown in FIGS. 13 and 14 illustrating prior art approaches are made as an integral part (from one piece). If the head element 16' was connected to the plunger 14' by shrink fitting or press fitting, the measurement devices according to FIGS. 13 and 14 (and the head units thereof) would fall into the scope of the invention, since according to the invention the guiding flange portion 18 is applied only optionally. If, however, the guiding flange portion and the broadened portion are configured such that they are fitted (relatively closely) against the inside wall of the tube element, the (preferably cylindrical) plunger can be guided along two different-diameter cylindrical surfaces (the broadened portion is guided by the wall of the tube element, while the narrower part of the plunger is guided by the guiding flange portion). Such a guide configuration allows for achieving an outstandingly high test point hit rate.

Figure 16:
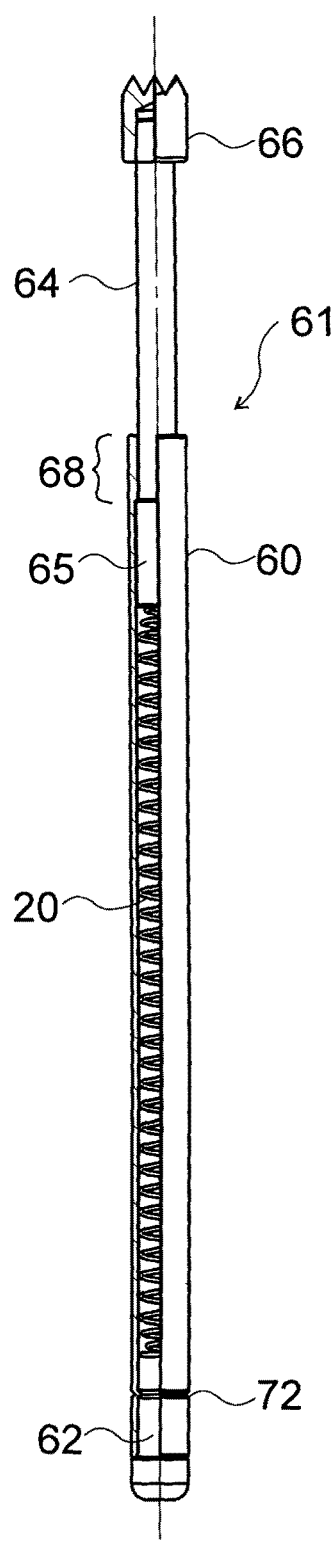
FIG. 16 is an exploded view illustrating a further embodiment of the invention.

In FIG. 16 a further embodiment of the contacting device according to the invention, namely, a measurement device 61 (pin probe) is shown. This embodiment is very similar to the one illustrated in FIG. 1, differing therefrom only in smaller details. In the embodiment according to FIG. 16 the measurement device 61 comprises a head element 66 attached to the end of a plunger 64, the plunger 64 being introduced into a tube element 60. The connection is made by press fitting or by shrink fitting.

A broadened portion 65 and a guiding flange portion 68 of the measurement device 61 are longer than the corresponding portions of the embodiment according to FIG. 1. In the present embodiment the length of the flange portion 68 (in the axial direction of the measurement device 61) is greater than the diameter of the plunger 64 in the portion encompassed by the flange portion 68. Also, the broadened portion 65 is longer than the flange portion 68. The extended-length flange portion 68 and broadened portion 65 provide better guidance for the plunger 64 compared to the corresponding components included in the embodiment of FIG. 1.

A biased resilient element 20 is arranged also in this embodiment between the terminal portion of the broadened portion 65 and a plug element 62. The plug element 62 differs from the plug element 12 in that the portion thereof seated against the end of the tube element 60 is thicker (in the axial direction of the tube element 60).

Figure 17:
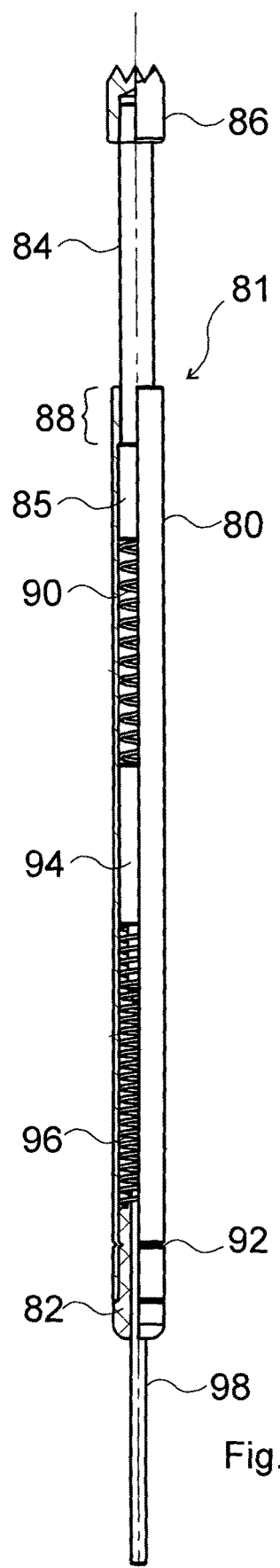
FIG. 17 is an exploded view illustrating a still further embodiment of the invention.

In FIG. 17 a further embodiment of the contacting device according to the invention, namely, a switching device 81 (switch probe) is shown. In this embodiment (i.e. also in the case wherein the contacting device is a switching device) the contacting device also comprises a head unit comprising a plunger 84 having a broadened portion 85 at its first end, and a head element being on a second end of the plunger 84; a tube element 80 receiving the broadened portion 85 at the third end, and keeping the broadened portion 85 in its inner space by means of an inward-projecting flange portion 88 arranged at the third end; and a resilient element 90 being arranged in the inner space of the tube element 80, and being supported against the end portion of the broadened portion 85 and against the closed fourth end of the tube element 80, and the head element 86 and the plunger 84 is connected to each other by shrink fitting or by press fitting.

The resilient element 90 and an additional resilient element 96 are separated by a contact element (guide element, contact-guide element) 94 inside the tube element 80. In this embodiment the resilient element 90 is supported against the closed fourth end of the tube element 80 via the contact element 94 and the additional resilient element 96, i.e. the contact element 94 and an additional resilient element 96 is inserted between the resilient element 90 and the closed (plugged) end.

In this embodiment the closed end of the tube element 80 is formed by a plug element 82, i.e. the end of the tube element 80 situated opposite the plunger 84 is closed by the plug element 82. In this embodiment a shaft 98 is introduced (integrated) in the plug element 82.

Some embodiments of the invention are related to a head unit for a contacting device suitable for performing measurements and/or other contact tests. The head unit according to the invention comprises a plunger having a broadened portion at its first end and a head element being on a second end of the plunger. In the head unit according to the invention the head element and the plunger are connected to each other by shrink fitting or by press fitting. The head unit according to the invention preferably forms a part of the contacting device according to the invention, however, the head unit can also be considered a separate component (can be sold as a separate component) and can be applied in a number of various contacting devices.

Such above description related to the contacting device wherein the head unit, i.e. the head element and the plunger of the contacting device according to the invention and their interconnection by shrink fitting or by press fitting are related also to the head unit according to the invention. Such features are, for example, the connection element and connection bore arranged on the plunger or on the head element, their relative dimensioning for press fitting or for shrink fitting (the connection element is preferably broader than the connection bore), and, in case of a self-locking connection, the conical or frustoconical configuration, providing the appropriate half cone angle, of the connection element and the side walls of the connection bore.

Figure 18:
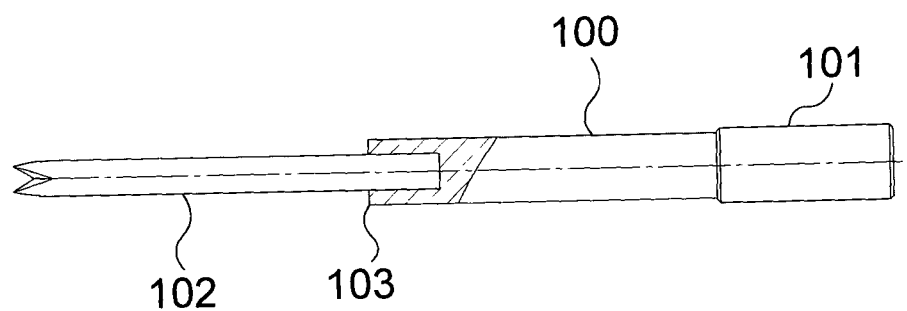
FIGS. 18-24 illustrate various embodiments of the head unit according to the invention.

A head unit according to an embodiment of the invention is illustrated in FIG. 18. In this embodiment the head unit comprises a plunger 100 having a broadened portion 101 and a head element 102 attached to a second end 103 thereof. The head element 102 is connected to the plunger 100 by shrink fitting or by press fitting also in this embodiment. The plunger 100 and the head element 102 according to this embodiment are different from the embodiments illustrated above. In this embodiment the second end 103 of the plunger 100 has a connection bore, the connection element being implemented as the end of the head element 102 that faces the plunger 100 and is introduced into the connection bore. Accordingly, in case shrink fitting is applied, in this embodiment the end of the head element 102 is to be heated to an appropriate temperature, while in the case of press fitting this end has to be pressed into the connection bore disposed on the plunger 100. In this embodiment the head element 102 is narrower than the plunger 100, with two of its tips being visible in side view. The advantage of this embodiment is that an (oblong) head element with much lower cross section relative to the plunger 100 can be attached to the plunger 100 (the connection bore of the plunger 100 has to be formed accordingly), which allows for saving a considerable amount of head element material (which is of higher strength and hardness and is more expensive) by applying in the head unit a head element that is (much) narrower than the plunger.

Figure 19:
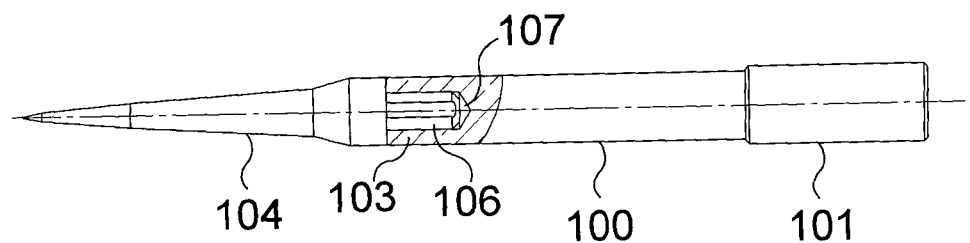

A similar embodiment is shown in FIG. 19; here a plunger 100 provided with a connection bore 107 is shown, to which a connection element 106 of a head element 104 is connected. In this embodiment the head element 104 comprises only one tip. As with other embodiments, the connection bore 107 has a cylindrical part (to which the connection element 106 is introduced by shrink fitting or by press fitting), adjacent to which, in the inside end portion of the bore 107 a conical region is formed.

Figure 20A:
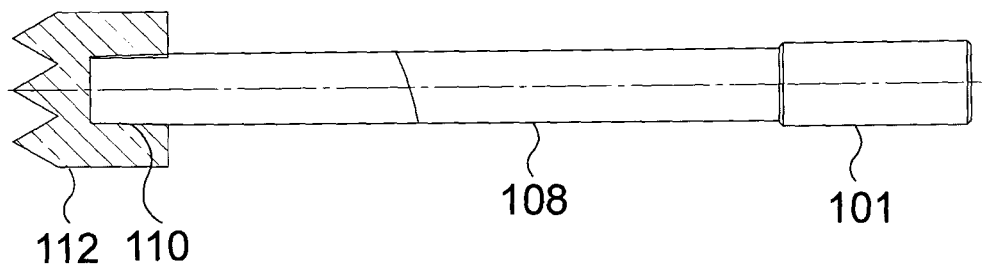
Figure 20B:
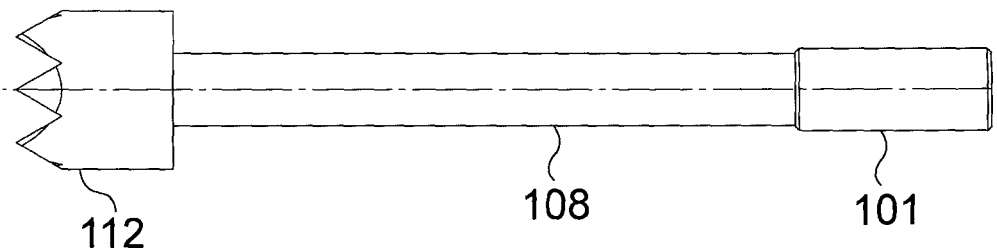

A plunger 108 comprising a broadened portion 101, as well as a head element 112 connected to the second end 110 of the plunger 108, i.e. an embodiment of the head unit according to the invention, is illustrated in sectional and plain side views in FIGS. 20A and 20B, respectively. In the views shown in the figures three spikes can be seen on the head element 112 that may also comprise further pins obstructed in this view.

Figure 21A:
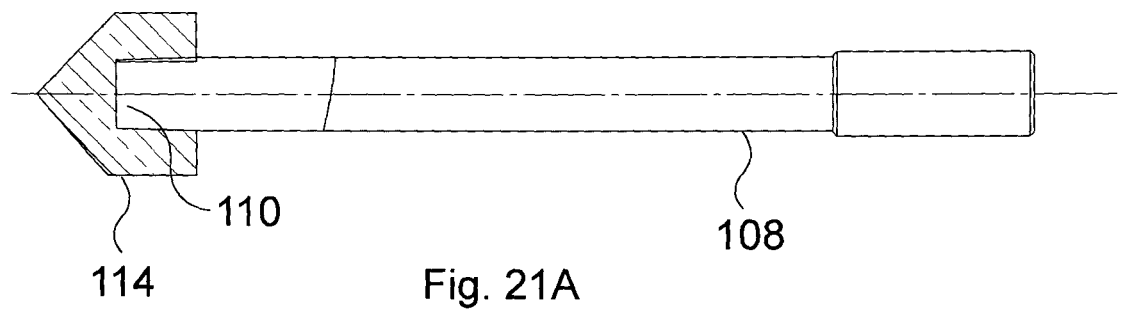
Figure 21B:
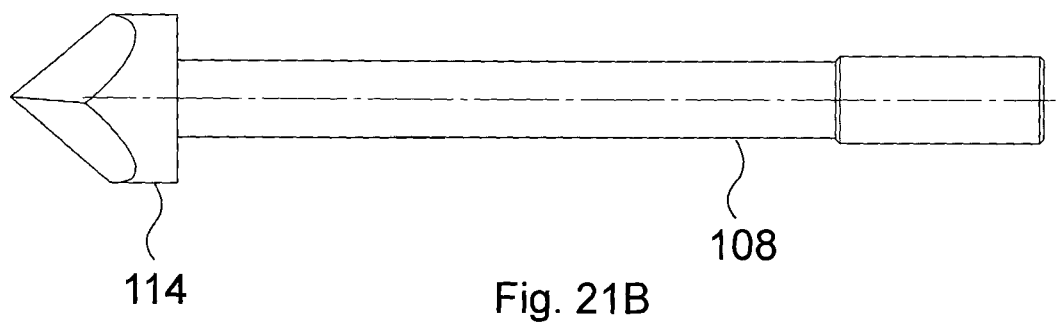

In FIGS. 21A and 21B a further embodiment of the head unit according to the invention is shown; in this embodiment there is a head element 114 connected to the plunger 108 (by shrink fitting or by press fitting). The head element 114 has only one tip, in the direction of which the element is narrowed by incision-like recesses. An embodiment comprising a plunger 108 provided with a head element 116 with only one tip is shown in FIGS. 22A and 22B.

Figure 22A:
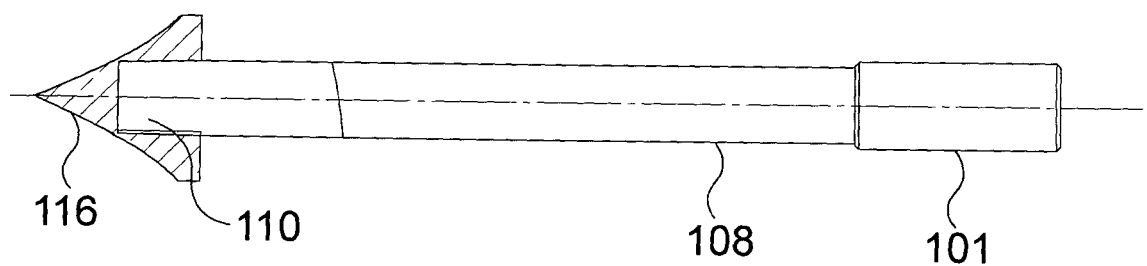
Figure 22B:
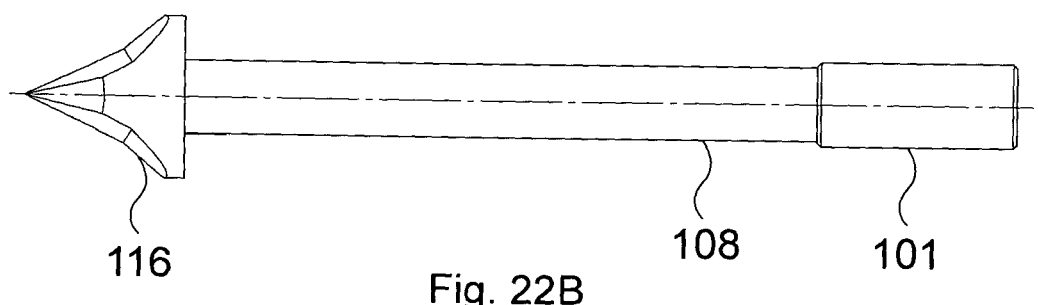

As with other similar embodiments, in the embodiment according to FIGS. 22A and 22B it is therefore preferable that, when a head element with a much larger width relative to the plunger is applied, in contrast to the known approaches there is no need for machining the head unit from a single piece of material (in which case a high amount of waste would be produced relative to the volume of the end product, i.e. the head unit), but the head element and the plunger are machined from separate pieces of material (that in many cases are different materials). This allows that the shape of the head element can be chosen much more freely compared to the known approaches, since the economical material consumption does not go wrong even if a very wide head element is applied.

Figure 23A:
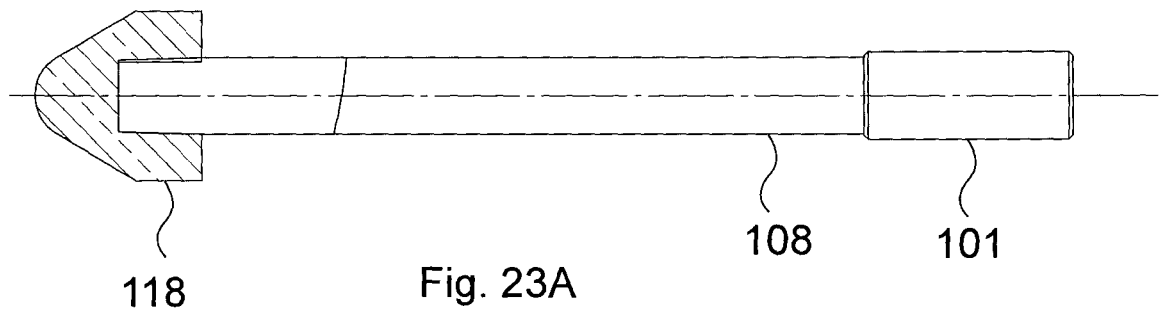
Figure 23B:
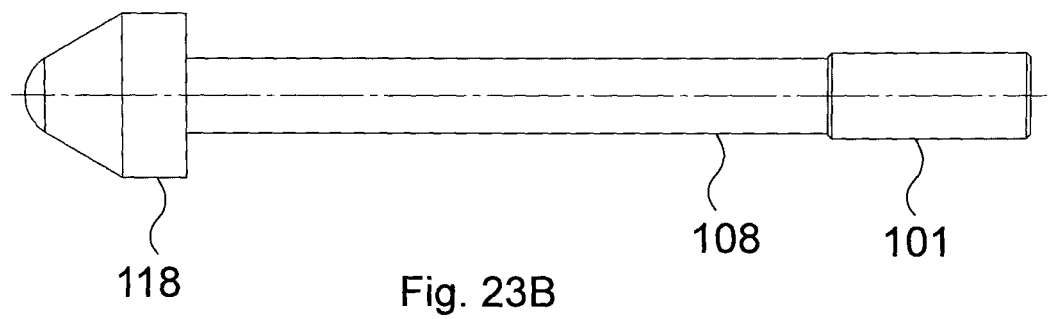
Figure 24:
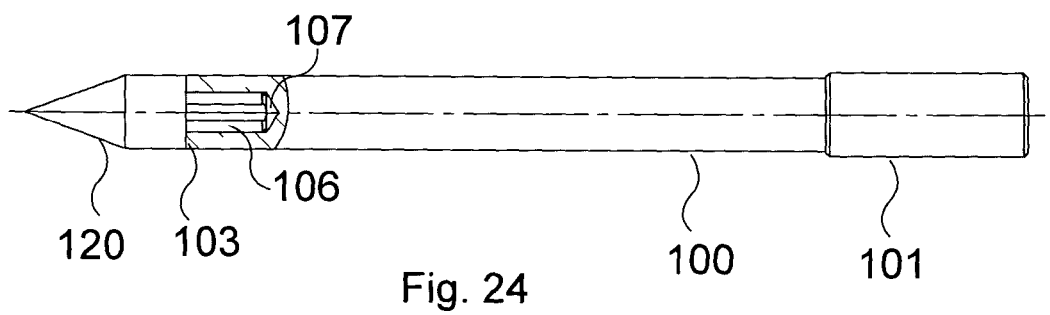

In FIGS. 23A and 23B there an embodiment of the head unit is shown wherein a rounded-tip head element 118 is connected to the plunger 108, The embodiment of the head unit according to FIG. 24 resembles the embodiment of FIG. 19 (it comprises a plunger 100), but comprises a head element 120 that is much shorter than the head element 104. The head element 120 also has a connection element 106 pressed or connected by shrink fitting to a connection bore 107. In this embodiment the head element 120 gives essentially an extension of the plunger 100, tapering into a single tip. In this embodiment the configuration according to the invention (head element and plunger made from separate pieces) leads to the advantage that it is sufficient to apply the material of the head element (which in some cases is a special one) only at the very end of the head unit (i.e. in the head element)—if the head element was made integrally as with the known approaches, and the head element were to be made of a special material, it would be necessary to make the entire head unit (head element, plunger) of that material. The advantage of this embodiment is that, in a manner illustrated in FIG. 24, a head unit having a uniform cross section until the peak-taper can be provided, wherein only the material of the head element is (optionally) specially selected. The (axial) length along which the material of the head element is applied can also be chosen (even a relatively short length can be sufficient).

Some embodiments of the invention relate to a method for manufacturing a contacting device, comprising the steps of manufacturing a head unit by connecting to each other, by means of shrink fitting or press fitting, a second end of a plunger having a broadened portion at its first end, and a head element, the second end of the plunger projects out from the tube element in case the broadened portion is abutted against the flange portion; and manufacturing a contacting device comprising a tube element having a third end and a fourth end opposite the third end, receiving the broadened portion of the plunger at the third end, and keeping the broadened portion in its inner space of the tube element by means of an inward-projecting flange portion arranged at the third end, and a resilient element being arranged in the inner space of the tube element, and being supported against the end portion of the broadened portion and against the closed fourth end of the tube element, such that the manufacturing of the head unit is performed after or before the plunger is introduced into the tube element (here the "before" and "after" alternatives typically correspond to the so-called "frontal assembly" and "rear assembly", but for example in embodiments wherein the diameter of the head is the same or smaller than the diameter (effective diameter) of the plunger, the interconnection of the head element and the plunger can be performed also before or after the introduction of the plunger).

Figure 25:
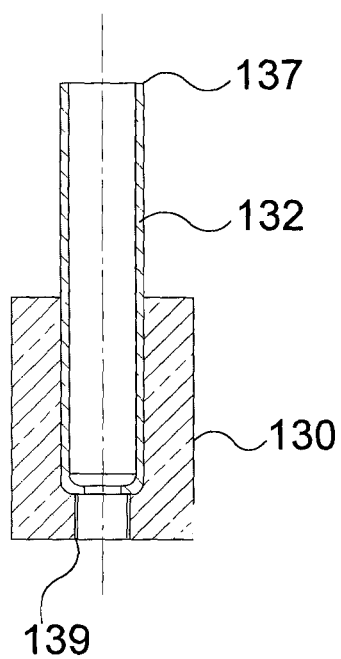
Figure 26:
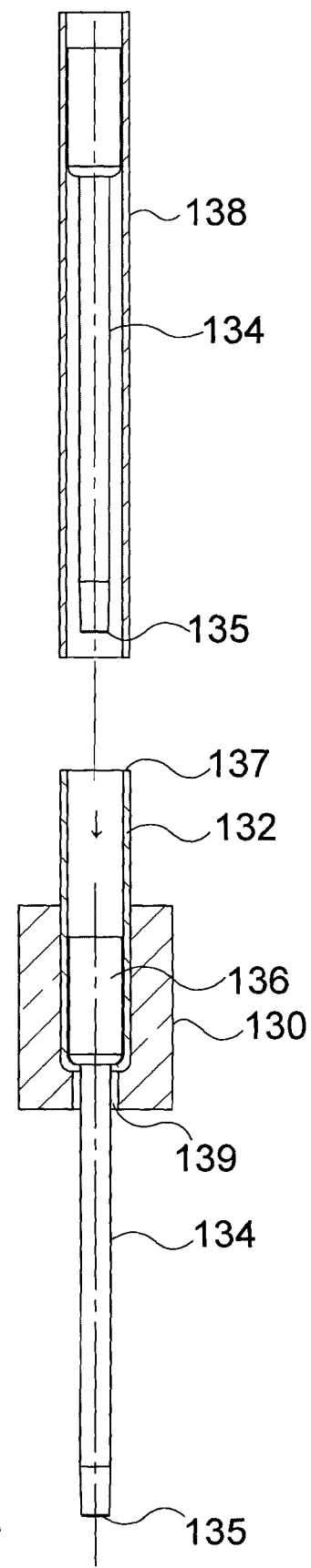

The method for manufacturing a contacting device according to the invention is illustrated in FIGS. 25-33 in an embodiment wherein the head unit is made after the plunger is introduced into the tube element (rear assembly). This embodiment of the method according to the invention comprises the steps of introducing a plunger 134 having a broadened portion 136 at its first end into the inner space of a tube element 132 (the tube element 132 is already shown in FIG. 25, it has in the present embodiment a guiding end 139 and a feeding end 137) through the fourth end, and preferably supporting the broadened portion 136 against a flange portion formed at the third end (the latter step is illustrated in FIG. 26; in which case the broadened portion 136 is seated on the flange portion in order to provide support for it). It can be seen in FIG. 26, that in case the broadened portion 136 is abutted against the flange portion (this state is shown in FIG. 26) the second end of the plunger 134 projects out from the tube element 132.

In this embodiment, therefore, the so-called rear assembly is applied, the term referring to the plunger being introduced into the tube element from the opposite end (this is made possible—even if the head element is wider than the plunger—by fixing the head element to the plunger posteriorly (subsequently)), and connecting the head element posteriorly (subsequently), when the plunger is already inside the tube element. Rear assembly allows for a much higher-precision configuration (more precise guiding), because there is no need for the subsequent tube element closing (which, with known devices, ensures that the plunger cannot leave the tube element in the case of frontal assembly).

Figure 31:
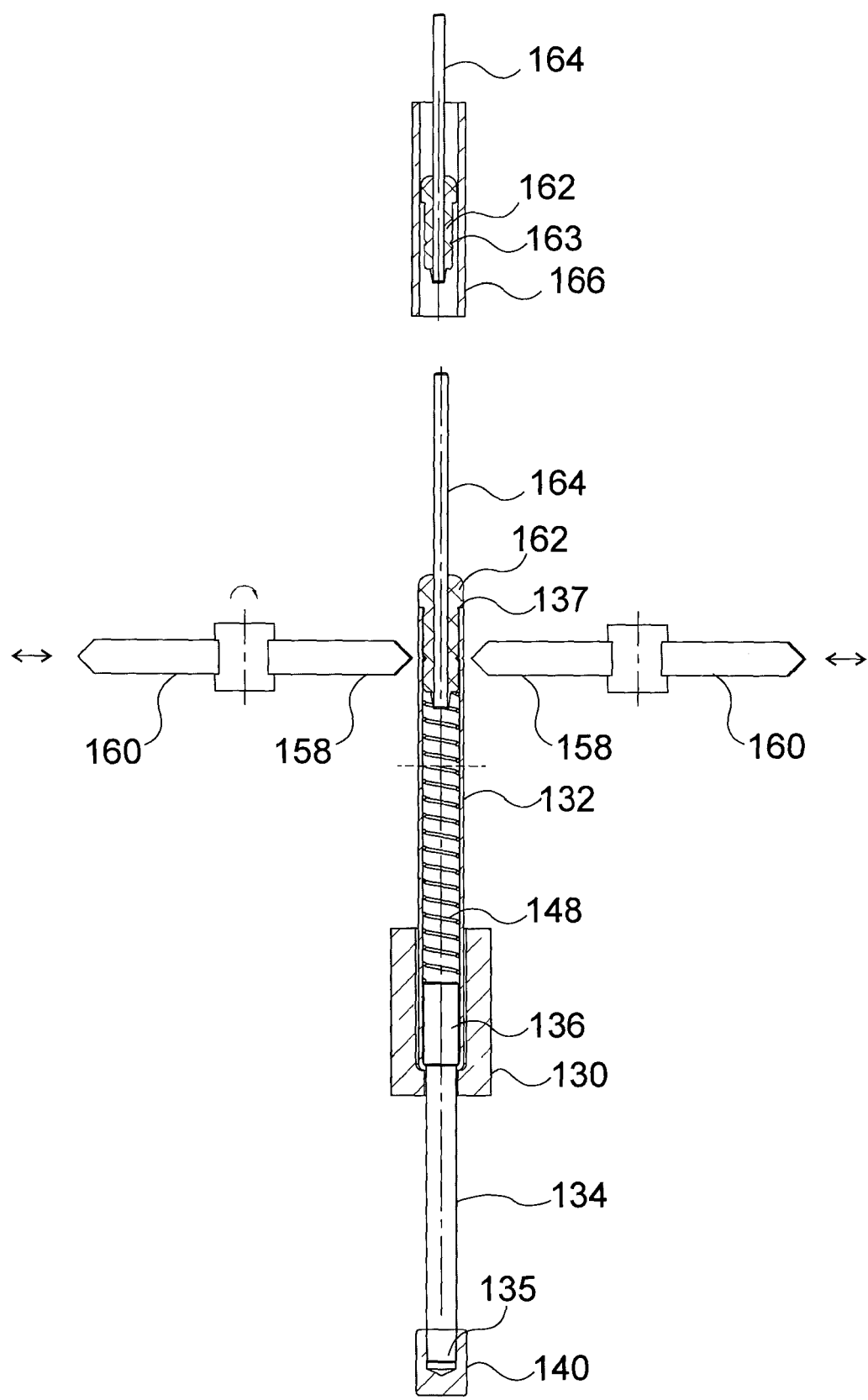

Furthermore, in this embodiment, the plunger 134 and a head element 140 are connected to each other by shrink fitting or by press fitting (see FIG. 27), then a resilient element 148 is introduced through the fourth end of the tube element 132 to the broadened portion 136 of the plunger 134 (see FIG. 28), and the fourth end of the tube element 132 is closed with a plug element 162, biasing the resilient element 148 with the plug element 162 (see FIG. 31: applying an additional resilient element 156 and a contact element 152).

In another embodiment of the method applying frontal assembly (not shown in the figures), after connecting the head element and the plunger to each other, the head unit is introduced into the tube element comprising a resilient element being supported against the closed fourth end of the tube element through the open third end while biasing the resilient element such that the broadened portion of the plunger enters the tube element, and the inward-projecting flange portion (for example, a narrowing) is formed at the open third end of the tube element such that the broadened portion is kept inside the tube element by means of the flange portion. In that case such a tube element is applied of which one end is closed (either by manufacturing or, for example, by a plug), the spring (resilient element) is passed against this closed end, the plunger is introduced into the tube element at the open end, and a narrowing is made in the tube element by press fitting, of course such that the broadened portion of the plunger is kept inside the tube element by the narrowing. This is the so-called frontal assembly that is also applied in some known solutions; the head unit according to the invention can also be applied preferably (attaching the head element either by shrink fitting or by press fitting) with such an assembly method.

These method steps can of course also be applied to manufacture other embodiments of the contacting device, i.e. the measurement device, the additional steps required for assembling the switching device (the introduction of a contact element, an additional resilient element, and a plug element provided with a shaft) are described below.

In an embodiment of the method for manufacturing a contacting device according to the invention the head element and the plunger are connected to each other by shrink fitting, a connection element is arranged on one of the plunger and the head element, and a connection bore being adapted for connecting to the connection element, is arranged on the other of the plunger and the head element for connecting the head element and plunger to each other by shrink fitting (in another embodiment of the method the connection element and the connection bore are configured for connection by press fitting), the connection element has a larger cross section than the connection bore, and, in the course of the connection by shrink fitting, the connection bore is heated until it expands to an extent that the connection element can be introduced into the connection bore, and the connection element is introduced into the connection bore. The connection bore can for example be heated by heating the entire head element such that the entire head element undergoes thermal expansion. The bore can also be heated such that it undergoes local heating, but this may result in the head element being deformed. In this embodiment no force is applied for making the connection (pressing is not performed); due to thermal expansion (and contraction) the dimensions of the connection element and the connection bore are such that the connection element can be introduced into the connection bore.

The connection between the head element and the plunger is made, after introducing the connection element into the connection bore, such that the previously heated component (the part of the head element surrounding the connection bore) cools down and contracts, and is thereby constricts, contracts on the component (connection element) not subjected to heating and cooling.

In a further embodiment of the method the connection element is cooled simultaneously with the heating the connection bore. By cooling the connection element—provided that is made of an appropriate (suitable for thermal expansion) material—the state wherein the connection element can be introduced into the connection bore can be attained earlier because the connection bore expands when heated while the size of the connection element is reduced when cooled.

In addition to the steps described above, in the embodiment according to FIGS. 25-33 further steps are also performed (the illustrated steps are performed to produce a switching device), the preferred optional features and details of the method for manufacturing a contacting device according to the invention are described with reference to the figures.

As shown in FIG. 25, in this embodiment during the method the tube element 132 is held, with the help of a supporting element 130—such as a seat element—configured to be open at the third end (guiding end 139) of the tube element 132, with its fourth end (feeding end 137) facing upwards, and the plunger 140 (FIG. 26), the resilient element 148 (FIG. 28) and the plug element 162 (FIG. 31) being fed by dropping into the tube element 132 through the fourth end (feeding end 137). An upward-facing orientation of the tube element 132 therefore preferably allows for feeding by dropping, i.e. for example feeding and assembling components utilizing a circular table (or alternatively the stations are simply arranged after one another). In this embodiment, therefore, the steps of the method are performed with the tube element 132 being held vertically; of course the steps can also be performed with the tube element being tilted or even in a horizontal position.

Thus, in FIG. 25 a tube element 132 supported by the supporting element 130 is shown (in this embodiment the tube element 132 is a switching device (switch probe) body that is being fed into the supporting element 130). In FIG. 25 it can be seen that the supporting element 130 is open at the guiding end 139 of the tube element 132 (which in this case faces downwards), i.e. the tube element 132 is held by the supporting element 130 such that the plunger to be introduced can project through the guiding end 139, as it is illustrated also in FIG. 26.

In FIG. 26 the feeding of the plunger 134 is illustrated. The plunger 134 is fed from a plunger feeder 138 such that the supporting element 130 is brought below the plunger feeder 138, or the plunger feeder 138 is brought above the supporting element 130. The plunger 134 is preferably get into the tube element 132 by letting it free-fall (it is dropped) through the feeding end 137 after releasing the plunger 134 from the plunger feeder 138. In FIG. 26 it is also shown that the plunger 134 has a second end 135 having a slightly tapering, frustoconical configuration, i.e. during pressing there is also a self-locking effect to a certain extent (as it was mentioned above, with such low half cone angles it is expedient to apply tolerances facilitating cold press fitting). For the sake of clarity in FIG. 26 there is not shown the entire tube element 132 (the length of the tube element is shown reduced).

Figure 27:
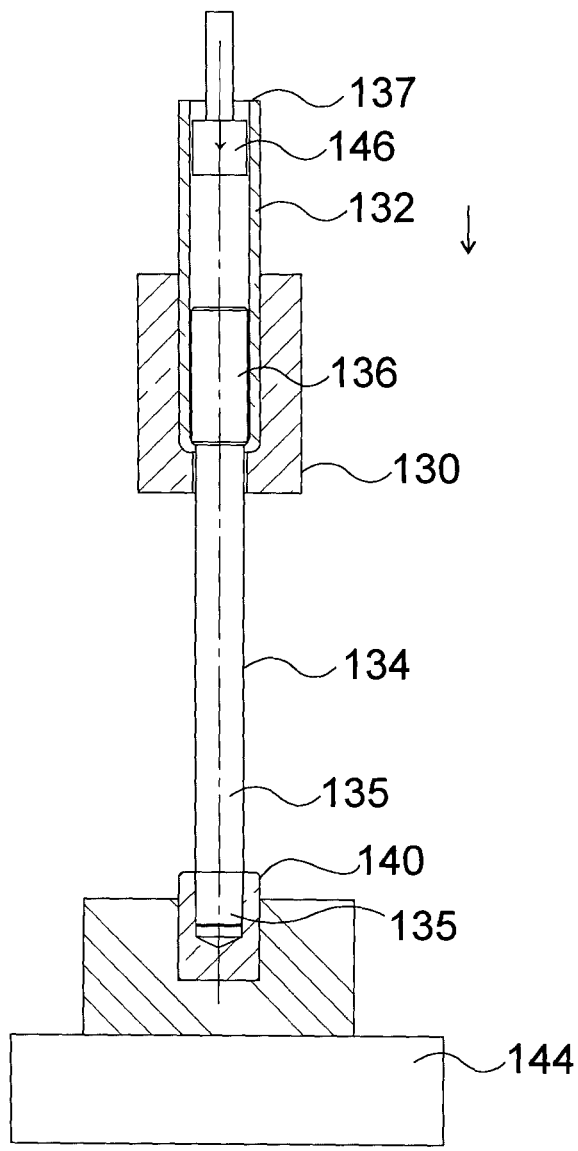

In FIG. 27 the step is illustrated wherein the head element 140 is connected to the plunger held by the supporting element 130. According to the above, connection is performed by press fitting. The connection is made as follows. In this embodiment the connection element is formed by the second end 135 of the plunger 134 (on the end, i.e. the connection element is constituted by the second end), and the connection bore is formed in the head element 140, and the second end 135 of the plunger 134 is directed onto the connection bore of the head element 140 (the end of the plunger being placed on the bore) after introducing the plunger 134 into the tube element 132, and while supporting the head element 140, and before closing the fourth end by means of the plug element, introducing a pressing force effecting element 146 through the fourth end of the tube element 132, the head element 140 is connected by press fitting to the second end 135 of the plunger 134 by means of the pressing force effecting element 146. The magnitude of the pressure force applied for press fitting is for example between 40 and 110 N, particularly between 50 and 100 N.

Furthermore, in this embodiment a pressing force is preferably measured during the press fitting by means of a force measurement device 144 supporting the head element 140. In the illustrated embodiment the head element 140 is supported (here support is provided from below, but in general for making the connection any type of support is sufficient) by means of the force measurement device 144 via a support body 142. The force measurement device 144 is not required for supporting the head element 140; the device (and therefore, force measurement) is only optionally included in this embodiment of the method.

In the embodiment of FIG. 27 the head element 140 is connected in such a manner that the head element 140 is supported from below, i.e. it cannot be displaced downwards while the pressing force effecting element 146 is applied to press the plunger 134 into the head element 140 (by axially pressing it onto the head element 140), also displacing the supporting element 130 in a downward direction; according to the method and as illustrated in the figure, the plunger 134 (and other plungers applied in this invention) have a rigid, non-flexible configuration, i.e. the plunger 134 does not undergo bending. In that case, therefore, the supporting element 130 is allowed to move vertically. In other steps this component is fixed in the vertical direction so that it can provide support for the tube element 132. After the downward motion the supporting element 130 preferably returns to its initial position, lifting the head element 140 from the support body 142 (during press fitting the head element 140 is received in an appropriately dimensioned bore of the support body 142).

Figure 28:
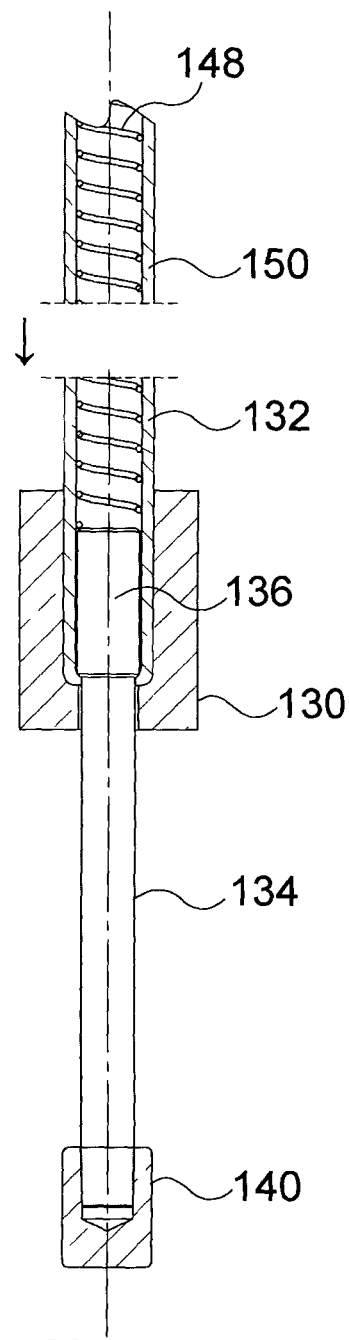

In the next step, illustrated in FIG. 28, a resilient element 148 (a helical spring or spring) is fed from a resilient element feed means 150 into the inner space of the tube element 132 through the feeding end 137. According to the vertical arrangement the resilient element 148 seats on (is dropped on) the end of the broadened portion 136 of the plunger 134, while in other arrangements the resilient element 148 is led thereto. The horizontal dashed lines in the figure indicate that the resilient element feed means 150 and the tube element 132 are not shown in their entirety.

In the next step, illustrated in FIG. 29, a contact element 152 is fed by means of a contact element feed means 154. At its end facing the additional resilient element 156 the contact element 152 has a broad portion that is adapted to fit into the inner space of the tube element 132, while at the other there is disposed a narrowed portion 153. The dashed lines in the figure indicate that the tube element 132 (and the resilient element 148 inside it) are not shown in their entirety, i.e. a part of the tube element 132 is cut out from the drawing at the dashed lines.

In the subsequent step, illustrated in FIG. 30 a resilient element 156 is fed from a resilient element feed means 157, the resilient element 156 being pulled on the narrowed portion 153 of the contact element 152.

In FIG. 31 the feeding-in of the plug element 162 according to the present embodiment is illustrated; the plug element 162 is fed in from a plug element feed means 166. The plug element 162 comprises a (electrically conducting) shaft 164 passed through the plug element 162, and a circumferential groove 163 is formed at the portion thereof that is narrower than the end portion (which is received in the tube element 132). In the figure it is also shown how the plug element 162 is fixed, during which the plug element 162 is introduced into the feeding end 137 of the tube element 132 (then the bottom and upper resilient elements 148, 156 are biased; the dashed horizontal lines in the figure indicate that the tube element 132 is not shown in its entirety, and only the ends of the resilient elements 148, 156 are shown and the contact element 152 is not shown) such that its end is circumferentially seated (supported) against the rim of the feeding end 137. The spring force of the applied resilient elements is preferably between 0.3 and 10 N, typically 1-2 N, at the optimally compressed state wherein the spring is compressed to ⅔ of the working stroke, i.e. the spring is essentially fully compressed.

In this embodiment therefore a plug element 162 having a groove 163 is applied, and during the closing of the tube element 132 with the plug element 162, the wall of the tube element 132 is pressed into the groove 163 by means of at least one (in this embodiment, two) pressing element 158 guided by a roller 160. In the present embodiment (and in other embodiments applying a plug element), therefore, the tube element 132 has to be made of such a material (e.g. a suitable metal) that the wall of the tube element 132 can be pressed into the groove 163 of the plug element 162. According to the figure, the pressing elements 158 can be moved in a horizontal direction, and, accordingly, the rollers can be turned about their axis of rotation. It is expediently provided for—for example by rotating the pressing elements 158 around the tube element 132 or by rotating the tube element 132—that the wall of the tube element 132 is pressed circularly into the groove 163; this kind of fixing can in principle be provided also by applying a not fully circular pressing. The plug element is therefore secured by pressing (rolling) it into the tube element (switching device body).

Figure 32:
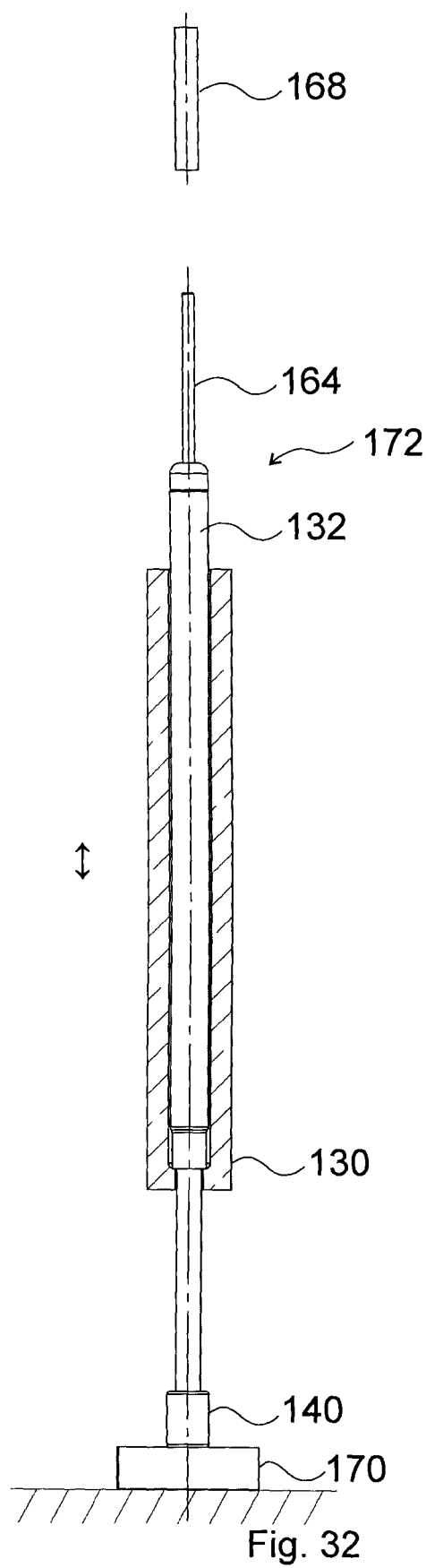

In FIG. 32 a subsequent, optionally included step is illustrated: the removal of the waste products. In this step the proper operation of the spring is verified (by measuring spring force) alongside the conductivity (for the detailed description of the operation of the switching device see the discussion of FIG. 34). The operation of the spring is checked by moving up and down multiple (4-5) times (compressing and depressing the spring). Switching device 172 meanwhile undergoes an up/down motion, the shaft 164 thereof being secured utilizing a supporting pin 168. When an appropriate amount of compression is applied, the switching of the switching device 172 occurs (see below), and the switching can be tested by measuring the current carried by the shaft 164. During the test the head element 140 therefore rests on a force measurement device 170 that is constantly monitoring the force arising as the compression/depression cycles are performed, and the shaft 164 is supported by the supporting pin 168, i.e. the supporting pin 168 is in constant contact with the shaft 164, the switching device 172 being moved up and down (together with the supporting element 130) utilizing the shaft 164; that is, the vertical-direction displacement of the supporting element 130 is allowed also in this step. If an anomaly is detected during the test (4-5 up/down cycles) based on the current measurements in the shaft 164 or on the force measurements applying the force measurement device 170, the given switching device 172 is labelled as waste and is separated from the properly functioning products.

Figure 33:
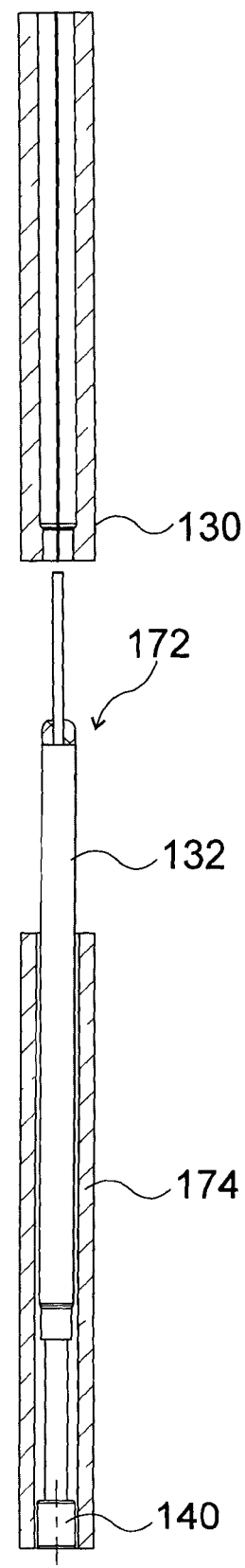

It is illustrated in FIG. 33 that in this embodiment preferably an unfoldable (openable) supporting element 130 is utilized being adapted for allowing the contacting device (in this embodiment, the switching device 172) to be dropped therefrom in its unfolded state; the contacting device is dropped from the supporting element 130 by unfolding the supporting element 130 after closing the tube element 132 by means of the plug element 162. As shown in FIG. 33 (illustrated by a solid line extending along the supporting element 130), the supporting element 130 is unfoldable; it has to be unfoldable to an extent that the finished contacting device can be removed (dropped) from it at the bottom. As it is also illustrated in FIG. 33, from the supporting element 130 the switching device 172 is passed to a packaging feed means 174, and so, as a result of applying an unfoldable supporting element 130, the switching device 172 can also be prepared for packaging. This step, therefore can have two outcomes, one producing an acceptable (non-waste) piece (then the piece is passed on to the packaging feed means 174), the other one being waste output.

Additionally, in a manner similar to the one described above, the method can also be performed such that the tube element (body) is placed in a seat (supporting element) as with the above described steps, the head element is slid underneath the head element along a constrained path, then the plunger arrives in the tube element, the plunger is pressed downwards from above, thereby the head element is placed on the plunger. This is followed by inserting the spring into the tube element from above, and then the plug element onto it, the latter is pressed by force into place, and the plug element is attached to the tube element (by pressing the side wall into the groove of the plug element). The only remaining step involves removing the finished measurement device from the seat.

Figure 34:
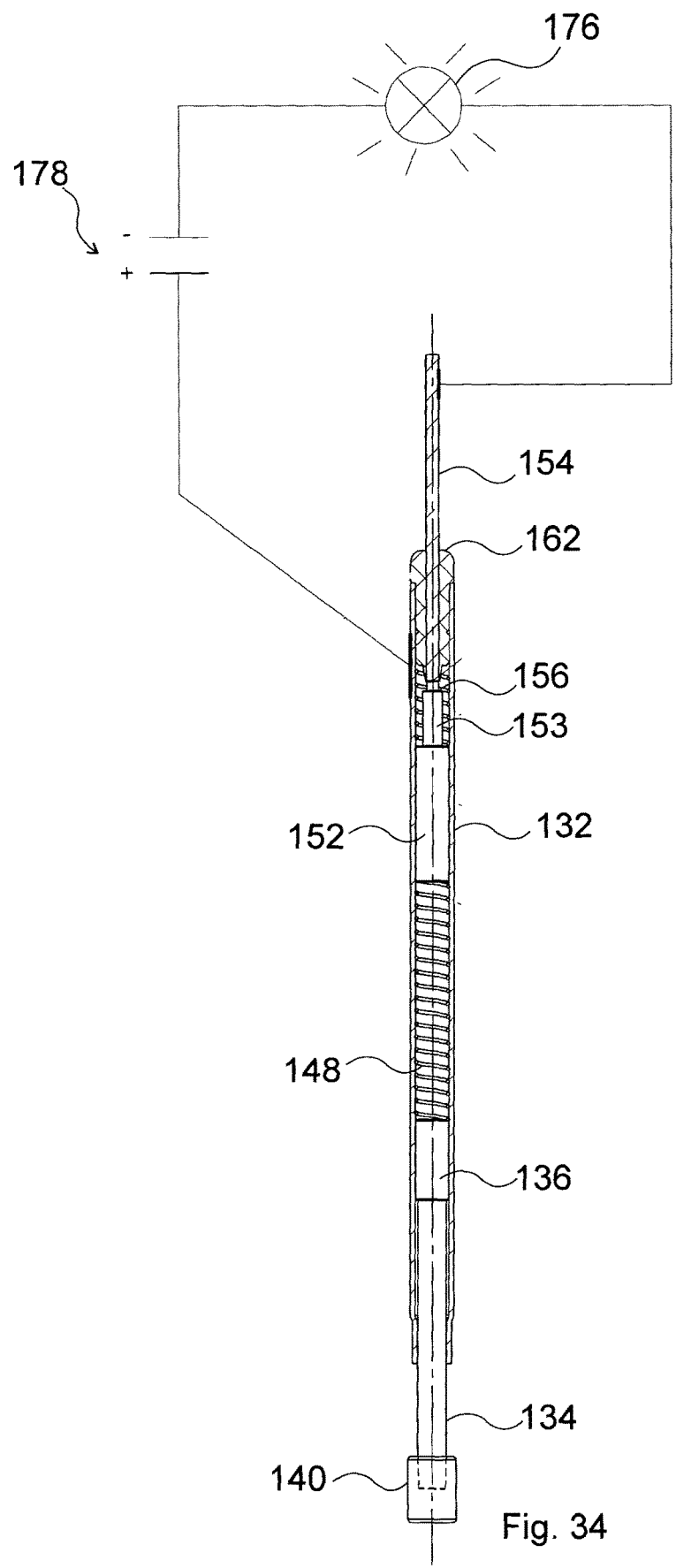
FIG. 34 illustrates the operation of an embodiment of the contacting device according to the invention.

FIG. 34 illustrates the operation of the switching device 172 in its biased state, i.e. when the plunger 134 is pressed into the tube element 132. The components in the switching device 172 are configured as follows: The head element 140 is made either of an electrically conductive material (in which case it provides electric contact with the material or component to be tested) or of an insulating material. If the head element 140 is made of an electrically conductive material it also allows for performing electric measurements on the placed component in addition to checking its physical presence because the head element carries electric current. If it is made of an insulating material, the device is only adapted for checking the physical presence of the component.

The tube element 132, the plunger 134, the resilient elements 148, 156, the contact element 152 and the shaft 164 are made of electrically conductive material, while the plug element 162 is made of an insulating material. FIG. 34 illustrates the situation wherein the plunger 134 is pushed into the tube element 132 to such an extent that the narrowed portion 153 of the contact element 152 comes into contact with the end of the shaft 164 protruding into the tube element 132, i.e. an electric contact is established between the contact element 152 and the shaft 164.

As shown in FIG. 34, a current consumer 176 and a power supply 178 are connected to the side wall of the tube element 132 and to the shaft 164. When, therefore, the plunger 134 is pushed inside to the extent shown in the drawing, resulting in the contact element 152 coming to contact with the end of the shaft 164, the consumer 176 circuit is closed and the lamp implementing the current consumer 176 is lit. If an electric contact has not yet been established between the contact element 152 and the shaft 164, i.e. switching has not been performed by the switching device, the circuit cannot be closed because the plug element 162 is made of insulating material. In the arrangement according to FIG. 34 therefore the establishing of an electric contact can be tested applying the switching device.

In contrast to that, in the embodiments of the contacting device according to the invention that implement a measurement device the head element—as with the plunger, the tube element and the resilient element—is made of a(n electrically) conductive material, by way of example, a metal. The material of the plug element is irrelevant; it can be made of either a conductive or an insulating material.

Implementing the features of the invention, in addition to a measurement device and a switching device, the contacting device according to the invention can also be realized as a further type of contacting device (a device adapted for contacting test points, i.e. suitable for establishing a contact). The contacting device implemented as a pin probe is basically applied in measuring technology as a current carrying device. However, it can also be applied in phones or other portable devices as an electrical connection component. These are customarily termed "battery probes" because they are applied for charging the batteries of portable devices. In various docking stations they can also be applied for charging small batteries. They are also made use of in medical technology and in the telecommunications industry. Switch probes (switching devices) function much like micro-switches: they move along a certain switching path to close the circuit. The switch point is attained typically when the plunger is pushed approximately 2-6 mm into the tube element, the different types of switch probe having different switch points (as with the above, this test is also a contact test, i.e. it involves placing the head element of the device on a certain test location or point to be tested; in addition to moving the device the object or point to be tested can also be moved nearer the to the device). Typical applications are cable harness manufacturing and the manufacturing of custom measuring equipment. Another expedient application is high-current probes that carry a current of 16-50 A and are adapted to work in high-temperature heat chambers. Here the typical temperature is around 150-200° C.

Figure 35:
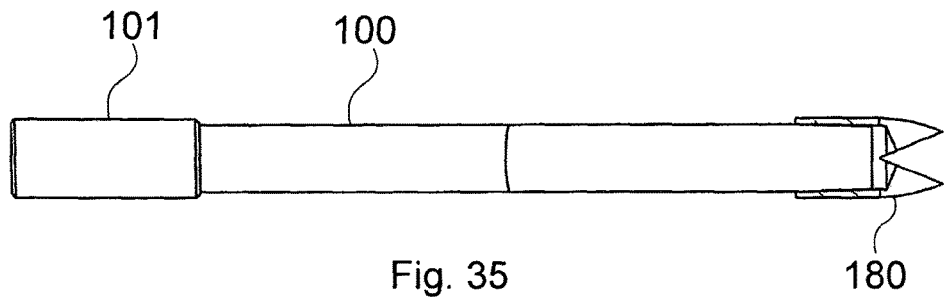
FIGS. 35-42 illustrate various further embodiments of the head unit according to the invention.
Figure 36:
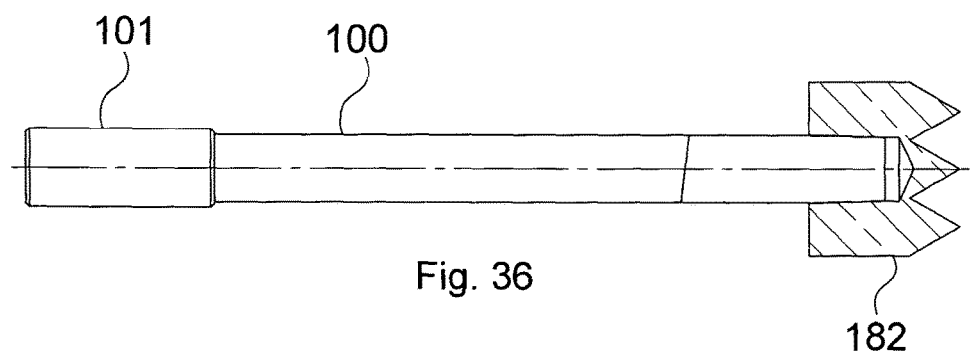

FIGS. 35-42 illustrate further embodiments of the head unit according to the invention. In FIG. 35 a head unit is depicted wherein a head element 180 is connected to the plunger 100. In a side view, two tips of the head element 180 are visible. In FIG. 36 a head unit is shown which comprises a head element 182 that is very similar to the one illustrated in FIGS. 20A-20B (with a plunger 100 that, as with the above, has a broadened portion 101 in all of FIGS. 35-42).

Figure 37:
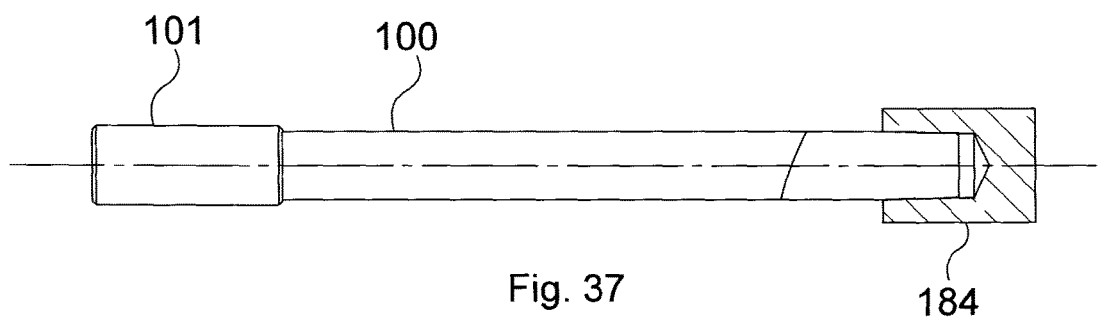

In FIG. 37 there can be seen a head unit comprising a head element 184 with a rectangular cross section. The flat portion of the head element 184 can be brought into contact with the surface to be tested, the head element 184 being very similar to the head element 140 depicted in FIGS. 27-34.

Figure 38:
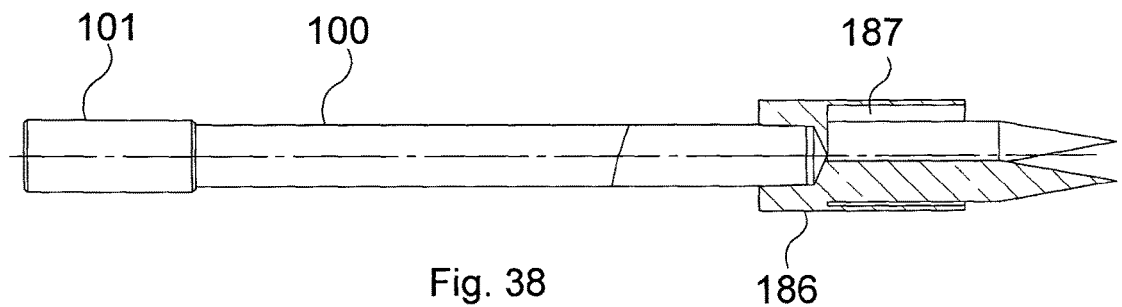
Figure 39:
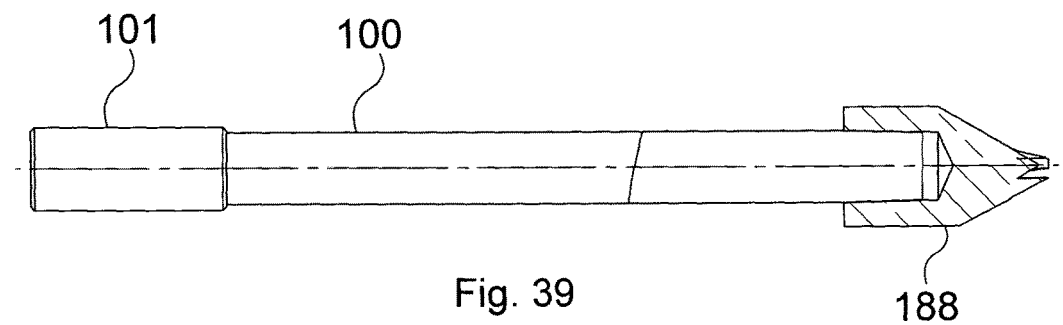

In FIG. 38 the plunger 100 is fitted with a head element 186. The head element 186 has multiple tips protruding from a sleeve portion 187, pointing away from the attachment location of the plunger 100 (in the direction of the contacting end). In the head unit according to FIG. 39 the plunger 100 is fitted with a head element 188. At the contacting end of the head element 188 there are arranged multiple small-sized tips.

Figure 40:
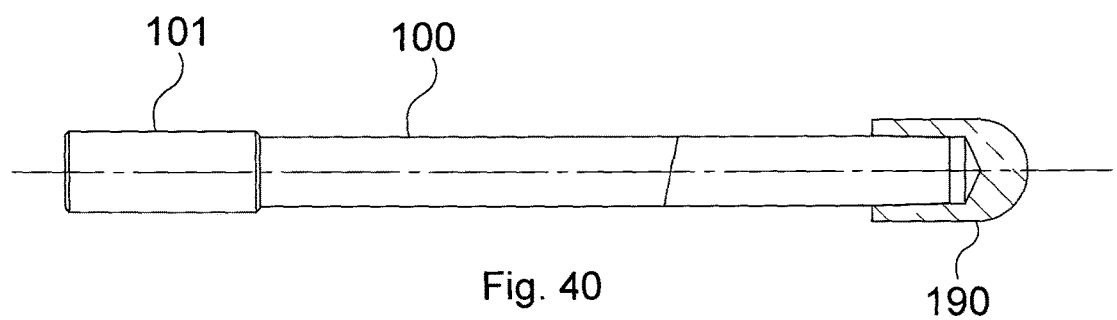
Figure 41:
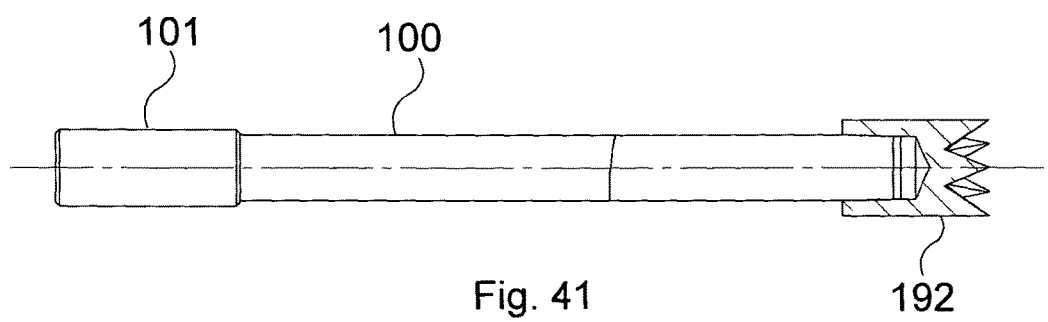

The head unit according to FIG. 40 comprises a head element 190 attached to the plunger 100. The contacting end of the head element 190 has a blunt, rounded-off configuration. The head unit shown in FIG. 41 comprises a head element 192 that has a number of tips at its end laying opposite the plunger 100. The tips of the head element 192 are bigger than the tips of the head element 188.

Figure 42:
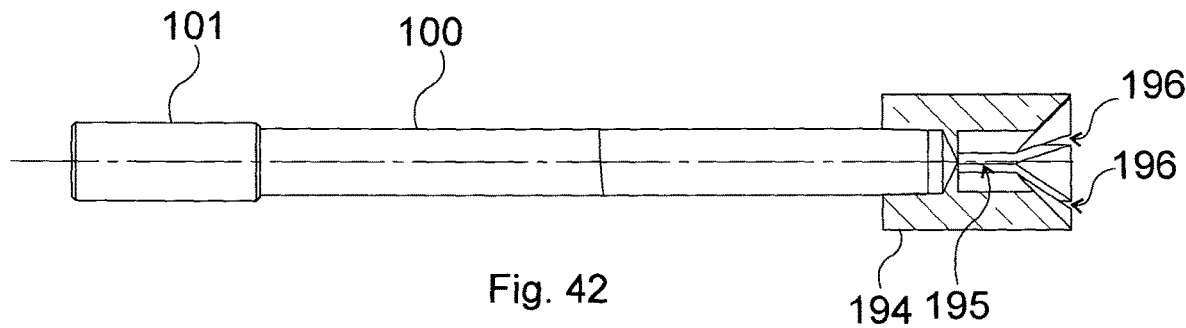

The head unit according to FIG. 42 comprises a head element 194 secured to the plunger 100. The head element 194 also has an essentially rectangular cross section, with a bore 195 being formed inside it along the extension of the axis of rotation of the plunger 100, with bores 196 leading from the bore 195 to the contacting end of the head element 194.

Some embodiments of the invention are related to a method for manufacturing a head unit for a contacting device adapted for measurements and/or other contact tests. In the course of the method for manufacturing a head unit according to the invention a head unit is manufactured by connecting, by means of shrink fitting or press fitting, the second end of a plunger comprising a broadened portion at its first end, and a head element to each other.

Such above descriptions related the contacting device and the head unit wherein the head unit, i.e. the head element and the plunger of the contacting device according to the invention and their connection to each other by shrink fitting or by press fitting are described also apply to the method for manufacturing a contacting device and the method for manufacturing a head unit according to the invention. Such features are, by way of example, the connection element and connection bore disposed on the plunger or on the head element, their relative dimensioning for press fitting or for shrink fitting (the connection element is preferably larger than the connection bore), and, in the case of a self-locking connection, the conical or frustoconical configuration, providing the appropriate half cone angle, of the connection element and the side walls of the connection bore. At the same time, the above disclosure related to the method for manufacturing a contacting device (by way of example, the features related to performing the shrink fitting connection) is of course also applicable to manufacturing the head unit.

The contacting device according to the invention has an increased number of components (separate head element, plunger, body (tube element), spring and optionally a plug element) compared to the known approaches. This, however, is still advantageous because the interconnection of the head element and the plunger according to the invention allows that, in the case of producing the plunger at a much greater quantity, the head elements can be connected to the plungers at a later stage of manufacturing corresponding to customers' needs (customer orders). According to the invention manufacturing becomes simpler and cheaper because— provided that the plunger is available—only the head element has to be manufactured (e.g., by lathe) to the appropriate dimensions and tolerances (manufacturing can be made modular). Material savings can be also reached because there is no need to cut the amount of material corresponding to the width difference between the head element and the plunger from a single component (as in the known solutions) but rather, the head element and the plunger can be manufactured separately with appropriate dimensions.

The embodiments of the contacting device according to the invention utilizing rear assembly (wherein one end of the tube element is closed by a plug element) can result in a product with increased safety because thanks to the accurately manufacturable (guide) flange portion the pin probe plunger cannot be "ejected" from the device (the resilient element is not able to push it out). In known approaches this is not provided at such a level of security.

The followings are noted in relation to the operation of the measurement device (pin probe) constituting an embodiment of the invention: The plunger (piston component, piston element) thereof contacts (is connected to) the test point of the component under test, and it is required to operate such that the pin probe is connected to the test point with the lowest possible loss of current in order to provide optimal measurement conditions. Therefore, the head element, plunger, tube element (typically also the resilient element) of the pin probe are all made of electrically conductive material. Pin probes—or even multiple ones in a pin probe matrix—are utilized e.g. for testing printed circuit boards. The role of a pin probe is to establish electric contact between the component under test (e.g. a test point of a printed circuit) and a socket wherein it is embedded. When the connection is made, the probes transfer current/voltage values. This is also a certain type of contact test for which the contacting device according to the invention is suitable.

The piston component (plunger) is most preferably made of a hardened material, such as steel and copper beryllium, though certain types (e.g., ones with blunter heads) can also be made of brass (not just the plunger but also the head element). The plunger and the head element are typically coated with a hard industrial gold layer with a hardness of 150-200 HV (Vickers hardness scale) for the sake of improved electrical conductivity, and for protecting the components from oxidation. For applications requiring low wear of the head a rhodium coating (600-1000 HV) can also be applied, but for "aggressive" types (having extremely pointed head elements) this cannot be utilized because rhodium coating is fragile, especially at high spring forces. A so-called chemical nickel coating can also be applied as a coating in applications where high chemical resistance is required (hardness is 400-600 HV). This coating is flexible (not prone to fracturing) and is thus favourably applied for coating aggressive (pointed) head elements (and the plungers connected thereto). Components made of copper beryllium and brass are more suited for carrying higher currents than components made of steel.

A spring (resilient element) arranged in the contacting device provides the required contact pressure, and thereby several hundred thousand of measurement cycles can be performed without errors. Spring force can be adjusted by adjusting the working stroke (essentially by adjusting the bias of the spring in the base position). The resilient elements (springs) are preferably made of the highest-quality, high-alloy spring steel, and often also of stainless steel.

The tube shaped cylinder (tube element) may be made of so-called new silver (NiAg), copper beryllium, as well as of brass and phosphor bronze alloy that has high tensile strength providing a long service life for the contacting device, while it also has perfect pressability (for e.g. attaching the plug element). The tube element preferably receives an industrial gold plated layer. The plunger, the head element and the tube element can of course receive other types of coating or plating, such as a hard nickel, palladium, rhodium, or silver coating.

The so-called crimping applied for securing the plug element has no adverse effects on contact resistance or on hit accuracy (in contrast to the crimping process applied for attaching the plunger in known approaches). The plug element can have a larger number of grooves than illustrated in the figures (can be fixed with multiple crimping operations), and is a component suited for high-volume production.

In the contacting device according to the invention the plunger is preferably made of a solid material that does not bend when a test point is contacted (when the measurement device is pushed against it). As it was mentioned above, certain components (e.g. the head element or the plunger of the switching device) can also be made of plastic. If, for example, the plunger is made of plastic, then a metallic head element can protect it against wear. By way of example, the following plastic materials can be advantageously applied: POM (polyoxymethylene), PEEK (polyetheretherketone), CEM1 (a composite epoxy material, the acronym CEM1 refers to a particular type), FR4-G10 (a glass fibre-reinforced epoxy material), nylon-6, nylon 6/6.

With a head element made of metal it can be more preferable to apply a plastic ring that protrudes more forward than the head element (and thus reaches the contact point earlier) in order that a metal-to-metal connection is brought about between the metal component under test and the head element only when metal components exceeding a given height are contacted.

Preferably, an air vent hole adapted to connect the connection bore with the environment such that air can be vented from the device when the connection element is pressed into it (i.e. a hole oriented laterally, that is, perpendicular to the axis of the head unit and the device) can also be arranged in the contacting device according to the invention.

The invention is, of course, not limited to the preferred embodiments described in details above, but further variants, modifications and developments are possible within the scope of protection determined by the claims.

The invention claimed is:

1. A method for manufacturing a contacting device, the method comprising manufacturing a head unit by connecting to each other, by means of shrink fitting or press fitting, a second end of a plunger (14, 36, 64, 84, 100, 108, 134) having a broadened portion (28, 29, 65, 85, 101, 136) at its first end, and a head element (16, 32, 42, 52, 66, 86, 102, 104, 120, 140), the second end of the plunger (14, 36, 64, 84, 100, 108, 134) projects out from the tube element (10, 60, 80, 132) in case the broadened portion (28, 29, 65, 85, 101, 136) is abutted against to the flange portion (18, 68, 88), and manufacturing a contacting device comprising a tube element (10, 60, 80, 132) having a third end and a fourth end opposite the third end, receiving the broadened portion (28, 29, 65, 85, 101, 136) of the plunger (14, 36, 64, 84, 100, 108, 134) at the third end, and keeping the broadened portion (28, 29, 65, 85, 101, 136) in its inner space by means of an inward-projecting flange portion (18, 68, 88) arranged at the third end, and a resilient element (20, 90, 148) being arranged in the inner space of the tube element (10, 60, 80, 132), being supported against the end portion of the broadened portion (28, 29, 65, 85, 101, 136) and against the closed fourth end of the tube element (10, 60, 80, 132), such that the manufacturing of the head unit is performed after the plunger (14, 36, 64, 84, 100, 108, 134) is introduced into the tube element (10, 60, 80, 132), wherein before connecting the plunger (14, 36, 64, 84, 100, 108, 134) and the head element (16, 32, 42, 52, 66, 86, 102, 104, 120, 140) to each other, the plunger (14, 36, 64, 84, 100, 108, 134) is introduced into the inner space of a tube element (10, 60, 80, 132) through the fourth end, then, after connecting the plunger (14, 36, 64, 84, 100, 108, 134) and the head element (16, 32, 42, 52, 66, 86, 102, 104, 120, 140) to each other, a resilient element (20, 90, 148) is introduced to the broadened portion (28, 29, 65, 85, 101, 136) of the plunger (14, 36, 64, 84, 100, 108, 134) through the fourth end of the tube element (10, 60, 80, 132), and the fourth end of the tube element (10, 60, 80, 132) is closed by means of a plug element (12, 62, 82, 162), biasing the resilient element (20, 90, 148) with the plug element (12, 62, 82, 162).

2. The method according to claim 1, characterised by connecting the head element (16, 52, 66, 86, 102, 104, 120, 140) and the plunger (14, 64, 84, 100, 108, 134) to each other by shrink fitting, a connection element (106) is arranged on one of the plunger (14, 64, 84, 100, 108, 134) and the head element (16, 52, 66, 86, 102, 104, 120, 140), and a connection bore (24, 107) being adapted for connecting to the connection element (106), is arranged on the other of the plunger (14, 64, 84, 100, 108, 134) and the head element (16, 52, 66, 86, 102, 104, 120, 140) for connecting the head element (16, 52, 66, 86, 102, 104, 120, 140) and the plunger (14, 64, 84, 100, 108, 134) to each other by shrink fitting, and the connection element (106) has a larger cross section than the connection bore (24, 107), and, in the course of the connection by shrink fitting, heating the connection bore (24, 107) until it expands to an extent that the connection element (106) can be introduced into the connection bore (24, 107), and introducing the connection element (106) into the connection bore (24, 107).

3. The method according to claim 2, characterised by cooling the connection element (106) simultaneously with the heating of the connection bore (24, 107).

4. The method according to claim 1, characterised by connecting the head element (16, 52, 66, 86, 102, 104, 120, 140) and the plunger (14, 64, 84, 100, 108, 134) to each other by press fitting, a connection element (106) is arranged on one of the plunger (14, 64, 84, 100, 108, 134) and the head element (16, 52, 66, 86, 102, 104, 120, 140), and a connection bore (24, 107) being adapted for connecting to the connection element (106) is arranged on the other of the plunger (14, 64, 84, 100, 108, 134) and the head element (16, 52, 66, 86, 102, 104, 120, 140) for connecting the head element (16, 52, 66, 86, 102, 104, 120, 140) and the plunger (14, 64, 84, 100, 108, 134) to each other by press fitting, and the connection element (106) has a larger cross section than the connection bore (24, 107).

5. The method according to claim 1, characterised in that a connection element is arranged on one of the plunger (36) and the head element (32, 42), and a connection bore (34, 44) being adapted for connecting to the connection element (106) is arranged on the other of the plunger (36) and the head element (32, 42) for connecting the head element (32, 42) and the plunger (36) to each other by press fitting, the side wall of the connection element and the connection bore (34, 44) is conical or frustoconical, and a half cone angle of the connection element and the connection bore (34, 44) is smaller than 1.5°, and the head element (32, 42) and the plunger (36) is connected to each other by press fitting.

6. The method according to claim 4, characterised in that the connection element is formed by the second end (135) of the plunger (14, 36, 64, 84, 100, 108, 134), and the connection bore (24, 34, 44) is formed in the head element (16, 32, 42, 52, 66, 86, 102, 104, 120, 140), and after introducing the plunger (14, 36, 64, 84, 100, 108, 134) into the tube element (10, 60, 80, 132), the second end (30, 40, 103, 110) of the plunger (14, 36, 64, 84, 100, 108, 134) is directed onto the connection bore (24, 34, 44) of the head element (16, 32, 42, 52, 66, 86, 102, 104, 120, 140), and while supporting the head element (16, 32, 42, 52, 66, 86, 102, 104, 120, 140) and, before closing the fourth end by means of a plug element (12, 62, 82, 162), introducing a pressing force effecting element (146) through the fourth end of the tube element (10, 60, 80, 132), the head element (16, 32, 42, 52, 66, 86, 102, 104, 120, 140) is connected by press fitting to the second end (30, 40, 103, 110) of the plunger (14, 36, 64, 84, 100, 108, 134) by means of the pressing force effecting element (146).

7. The method according to claim 6, characterised by measuring pressing force during the press fitting by means of a force measurement device (144) supporting the head element (16, 32, 42, 52, 66, 86, 102, 104, 120, 140).

8. The method according to claim 1, characterised by utilizing a plug element (12, 62, 82, 162) having a groove (56, 163), and pressing, during the closing of the tube element (10, 60, 80, 132) with the plug element (12, 62, 82, 162), the wall of the tube element (10, 60 80, 132) into the groove (56, 163) by means of at least one pressing element (158) guided by a roller (160).

9. The method according to claim 1, characterised by holding, by means of a supporting element (130) being open at the third end of the tube element (10, 60, 80, 132), the tube element (10, 60, 80, 132) such that the fourth end faces upwards, and feeding the plunger (16, 32, 42, 52, 66, 86, 102, 104, 120, 140), the resilient element (20, 148), and the plug element (12, 62, 82, 162) into the tube element (10, 60, 80, 132) through the feeding end by dropping.

10. The method according to claim 9, characterised by utilizing an unfoldable supporting element (130) being adapted for allowing the contacting device to be dropped therefrom in its unfolded state, and dropping the contacting device from the supporting element (130) by unfolding the supporting element (130) after closing the tube element (10, 60, 80, 132) by means of the plug element (12, 62, 82, 162).

11. The method according to claim 1, characterised by applying a head element (16, 32, 42, 52, 66, 86, 102, 104, 120, 140) made of palladium alloy, and a plunger (14, 36, 64, 84, 100, 108, 134) made of a material different from palladium alloy.

* * * * *